(12) United States Patent
Wildeson et al.

(10) Patent No.: US 11,677,043 B2
(45) Date of Patent: Jun. 13, 2023

(54) LIGHT EMITTING DIODE DEVICE

(71) Applicant: Lumileds LLC, San Jose, CA (US)

(72) Inventors: Isaac Wildeson, Nashua, NH (US); Robert Armitage, Cupertino, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/940,241

(22) Filed: Sep. 8, 2022

(65) Prior Publication Data
US 2023/0006093 A1 Jan. 5, 2023

Related U.S. Application Data

(63) Continuation of application No. 17/155,499, filed on Jan. 22, 2021, now Pat. No. 11,476,386.
(Continued)

(51) Int. Cl.
| | |
|---|---|
| *H01L 33/08* | (2010.01) |
| *H01L 33/06* | (2010.01) |
| *H01L 33/10* | (2010.01) |
| *H01L 33/00* | (2010.01) |
| *H01L 33/50* | (2010.01) |

(Continued)

(52) U.S. Cl.
CPC .......... *H01L 33/06* (2013.01); *H01L 33/005* (2013.01); *H01L 33/0093* (2020.05); *H01L 33/08* (2013.01); *H01L 33/10* (2013.01); *H01L 33/12* (2013.01); *H01L 33/36* (2013.01);
(Continued)

(58) Field of Classification Search
CPC ..... H01L 33/10; H01L 33/08; H01L 25/0753; H01L 33/06; H01L 33/0093; H01L 33/36; H01L 2933/0016; H01L 33/46; H01L 33/12; H01L 33/005; H01L 2933/0025;
(Continued)

(56) References Cited

U.S. PATENT DOCUMENTS

| | | | |
|---|---|---|---|
| 6,822,991 | B2 | 11/2004 | Collins, III et al. |
| 10,103,195 | B2 | 10/2018 | Damilano et al. |

(Continued)

OTHER PUBLICATIONS

PCT International Search Report and Written Opinion in PCT/US2021/051523 dated Jan. 11, 2022, 10 pages.
(Continued)

*Primary Examiner* — Savitri Mulpuri
(74) *Attorney, Agent, or Firm* — Servilla Whitney LLC

(57) ABSTRACT

Described are light emitting diode (LED) devices including a combination of electroluminescent quantum wells and photo-luminescent active regions in the same wafer. A first group of QWs with shortest emission wavelength is placed between the p- and n-layers of a p-n junction. Other groups of QWs with longer wavelengths are placed outside the p-n junction in a part of the LED structure where electrical injection of minority carriers does not occur. Electroluminescence emitted by the first group of QWs is absorbed by other group(s) and re-emitted as longer wavelength light. The color of an individual die made on the wafer can be controlled by either etching away unwanted groups of longer-wavelength QWs at the position of that die, or keeping them intact. Wavelength-selective mirrors that increase down conversion efficiency may be selectively applied to die where longer wavelength emission is desired. The use of tunnel junction contacts facilitates integration of wavelength selective mirrors to external surfaces of the die and avoids problems of conductivity type conversion on etched p-GaN layers.

16 Claims, 27 Drawing Sheets

Related U.S. Application Data

(60) Provisional application No. 63/126,038, filed on Dec. 16, 2020.

(51) Int. Cl.
*H01L 33/46* (2010.01)
*H01L 33/36* (2010.01)
*H01L 33/12* (2010.01)
*H01L 27/15* (2006.01)

(52) U.S. Cl.
CPC ............ *H01L 33/46* (2013.01); *H01L 33/502* (2013.01); *H01L 27/153* (2013.01)

(58) Field of Classification Search
CPC ........... H01L 33/502; H01L 2933/0041; H01L 27/153
See application file for complete search history.

(56) References Cited

U.S. PATENT DOCUMENTS

| | | | |
|---|---|---|---|
| 10,804,429 | B2 | 10/2020 | Wildeson et al. |
| 11,081,622 | B2 | 8/2021 | Wildeson et al. |
| 2015/0001561 | A1 | 1/2015 | Katsuno et al. |
| 2017/0018679 | A1 | 1/2017 | Lee |
| 2017/0213868 | A1 | 7/2017 | Damilano et al. |
| 2019/0198709 | A1 | 6/2019 | Wildeson et al. |
| 2019/0393379 | A1 | 12/2019 | Armitage et al. |
| 2020/0127173 | A1 | 4/2020 | Park et al. |

OTHER PUBLICATIONS

Chang, Shoou-Jinn, et al., "Cascaded GaN Light-Emitting Diodes With Hybrid Tunnel Junction Layers", IEEE Journal of Quantum Electronics, vol. 51, No. 8, Aug. 2015.

Dupré, Ludovic, et al., "Processing and characterization of high resolution GaN/InGaN LED arrays at 10 micron pitch for micro display applications.", Proc. of SPIE vol. 10104 1010422-1.

El-Ghoroury, Hussein S., et al., "Growth of monolithic full-color GaN-based LED with intermediate carrier blocking layers", AIP Advances 6, 075316 (2016).

Schubert, Martin F., "Interband tunnel junctions for wurtzite III-nitride semiconductors based on heterointerface polarization charges", Physical Review B 81, 035303 2010.

Sekiguchi, Hiroto, et al., "Emission color control from blue to red with nanocolumn diameter of InGaN/GaN nanocolumn arrays grown on same substrate", Applied Physics Letters 96, 231104 (2010).

LIGHT EMITTING DIODE DEVICE

CROSS-REFERENCE TO RELATED APPLICATIONS

This application is a continuation of U.S. application Ser. No. 17/155,499, filed on Jan. 22, 2021, which claims priority to U.S. Provisional Application No. 63/126,038, filed Dec. 16, 2020, the entire disclosures of which are hereby incorporated by reference herein.

TECHNICAL FIELD

Embodiments of the disclosure generally relate to arrays of light emitting diode (LED) devices and methods of manufacturing the same. More particularly, embodiments are directed to light emitting diode devices including photoluminescent quantum wells and electroluminescent quantum wells, and a bilayer contact.

BACKGROUND

A light emitting diode (LED) is a semiconductor light source that emits visible light when current flows through it. LEDs combine a P-type semiconductor with an N-type semiconductor. LEDs commonly use a III-group compound semiconductor. A III-group compound semiconductor provides stable operation at a higher temperature than devices that use other semiconductors. The III-group compound is typically formed on a substrate formed of sapphire or silicon carbide (SiC).

Typically, color LED displays are manufactured by picking LEDs from separate blue, green and red emitting wafers and then aligning them in alternating close proximity on the display. This method is difficult to apply for high resolution displays which require micron-sized LED pixels. As the die size decreases to satisfy resolution requirements, larger and larger numbers of die must be transferred at each pick and place operation to populate a display of given dimensions. Manufacturing LED displays would be greatly simplified if LEDs of the three primary colors could be fabricated at controlled positions within the same semiconductor wafer.

Accordingly, there is a need for LED devices where LEDs of different colors are in the same wafer.

SUMMARY

Embodiments of the disclosure are directed to LED devices and methods for manufacturing LED devices. In one or more embodiments, a light emitting diode (LED) device comprises: a first sub-pixel comprising a first anode contact on a first mesa, the first mesa having a first mesa tunnel junction on a first mesa electroluminescent quantum well on a first mesa n-type layer on a substrate; a second sub-pixel comprising a second anode contact on a second mesa, the second mesa having a second mesa first photoluminescent quantum well and a second mesa second photoluminescent quantum well on a second mesa tunnel junction on a second mesa electroluminescent quantum well on a second mesa n-type layer on the substrate; a third sub-pixel comprising a third anode contact on a third mesa, the third mesa having a third mesa photoluminescent quantum well on a third mesa tunnel junction on a third mesa electroluminescent quantum well on a third mesa n-type layer on the substrate; a first trench separating the first sub-pixel and the second sub-pixel; a second trench separating the second sub-pixel and the third sub-pixel; and a dielectric layer formed over at least a portion of the first sub-pixel, the second sub-pixel, and the third sub-pixel.

Other embodiments of the disclosure are directed to a light emitting diode (LED) system comprising: a light emitting diode (LED) array comprising a first sub-pixel adjacent to a second sub-pixel, the second sub-pixel adjacent to a third sub-pixel; the first sub-pixel, second sub-pixel, and third sub-pixel separated by one or more trenches, a dielectric layer formed over at least a portion of the first sub-pixel, the second sub-pixel, and the third sub-pixel; the first sub-pixel comprising a first mesa having a first mesa tunnel junction on a first mesa electroluminescent quantum well on a first mesa n-type layer, the second sub-pixel comprising a second mesa having a second mesa first photoluminescent quantum well and a second mesa second photoluminescent quantum well on a second mesa tunnel junction on a second mesa electroluminescent quantum well on a second mesa n-type layer, the third sub-pixel comprising a third mesa having a third mesa photoluminescent quantum well on a third mesa tunnel junction on a third mesa electroluminescent quantum well on a third mesa n-type layer; an LED device attach region having a first electrode coupled to a first anode contact on the first sub-pixel, a second electrode coupled to a second anode contact on the second sub-pixel, and a third electrode coupled to a third anode contact on the third sub-pixel; and driver circuitry configured to provide independent voltages to one or more of the first electrode, the second electrode, and the third electrode.

One or more embodiments are directed to a method of manufacturing an LED device. In one or more embodiments, the method comprises: forming a nucleation layer on a substrate; forming a defect reduction layer on the nucleation layer; forming an n-type layer on the defect reduction layer; forming at least one electroluminescent quantum well on the n-type layer; forming a tunnel junction on the at least one electroluminescent quantum well; forming a n-type layer on the tunnel junction; forming at least one first photoluminescent quantum well on the n-type layer; forming at least one second photoluminescent quantum well on the at least one first photoluminescent quantum well; forming a first mesa, a second mesa, and a third mesa, the first mesa and the second mesa separated by a first trench, the second mesa and the third mesa separated by a second trench; removing the at least one first photoluminescent quantum well and the at least one second photoluminescent quantum well from the first mesa; removing the at least one second photoluminescent quantum well from the third mesa; conformally depositing a dielectric layer on the first mesa, the second mesa, and the third mesa; forming a contact hole in the first mesa, the second mesa, and the third mesa; and forming a first contact on the first mesa, a second contact on the second mesa, and a third contact on the third mesa.

Embodiments of the disclosure are directed to LED devices and methods for manufacturing LED devices. In one or more embodiments, a light emitting diode (LED) device comprises: a first sub-pixel comprising a first cathode contact on a first mesa, the first mesa having first mesa electroluminescent quantum well on a first mesa tunnel junction on a on a first mesa n-type layer; a second sub-pixel comprising a second cathode contact on a second mesa, the second mesa having a second mesa first photoluminescent quantum well and a second mesa second photoluminescent quantum well on a second mesa electroluminescent quantum well on a second mesa tunnel junction on a second mesa n-type layer; a third sub-pixel comprising a third cathode contact on a third mesa, the third mesa having a third mesa photoluminescent quantum well on a third mesa electroluminescent quantum well on a third mesa tunnel junction on a third mesa n-type layer; a first trench separating the first sub-pixel and the second sub-pixel; a second trench separating the second sub-pixel and the third sub-pixel; and a dielectric layer formed over at least a portion of the first sub-pixel, the second sub-pixel, and the third sub-pixel.

Other embodiments of the disclosure are directed to a light emitting diode (LED) system comprising: a light emitting diode (LED) array comprising a first sub-pixel adjacent to a second sub-pixel, the second sub-pixel adjacent to a third sub-pixel; the first sub-pixel, second sub-pixel, and third sub-pixel separated by one or more trenches, a dielectric layer formed over at least a portion of the first sub-pixel, the second sub-pixel, and the third sub-pixel; the first sub-pixel comprising a first mesa having a first mesa electroluminescent quantum well on a first mesa tunnel junction on a first mesa n-type layer, the second sub-pixel comprising a second mesa having a second mesa first photoluminescent quantum well and a second mesa second photoluminescent quantum well on a second mesa electroluminescent quantum well on a second mesa tunnel junction on a second mesa n-type layer, the third sub-pixel comprising a third mesa having a third mesa photoluminescent quantum well on a third mesa electroluminescent quantum well on a third mesa tunnel junction on a third mesa n-type layer; an LED device attach region having a first electrode coupled to a first cathode contact on the first sub-pixel, a second electrode coupled to a second cathode contact on the second sub-pixel, and a third electrode coupled to a third cathode contact on the third sub-pixel; and driver circuitry configured to provide independent voltages to one or more of the first electrode, the second electrode, and the third electrode.

One or more embodiments are directed to a method of manufacturing an LED device. In one or more embodiments, the method comprises of manufacturing an LED device comprises: forming a nucleation layer on a substrate; forming a defect reduction layer on the nucleation layer; forming an n-type layer on the defect reduction layer; forming at least one first photoluminescent quantum well on the n-type layer; forming at least one second photoluminescent quantum well on the at least one first photoluminescent quantum well; forming at least one electroluminescent quantum well on the second photoluminescent quantum well; forming a tunnel junction on the at least one electroluminescent quantum well; forming an n-type layer on the tunnel junction; forming a first mesa, a second mesa, and a third mesa, the first mesa and the second mesa separated by a first trench, the second mesa and the third mesa separated by a second trench; removing the at least one first photoluminescent quantum well and the at least one second photoluminescent quantum well from the first mesa; removing the at least one second photoluminescent quantum well from the third mesa; conformally depositing a dielectric layer on the first mesa, the second mesa, and the third mesa; forming a contact hole in the first mesa, the second mesa, and the third mesa; forming a first contact on the first mesa, a second contact on the second mesa and a third contact on the third mesa; and removing the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

To facilitate understanding, identical reference numerals have been used, where possible, to designate identical elements that are common to the figures. The figures are not drawn to scale. For example, the heights and widths of the mesas are not drawn to scale.

DETAILED DESCRIPTION

Figure 1:
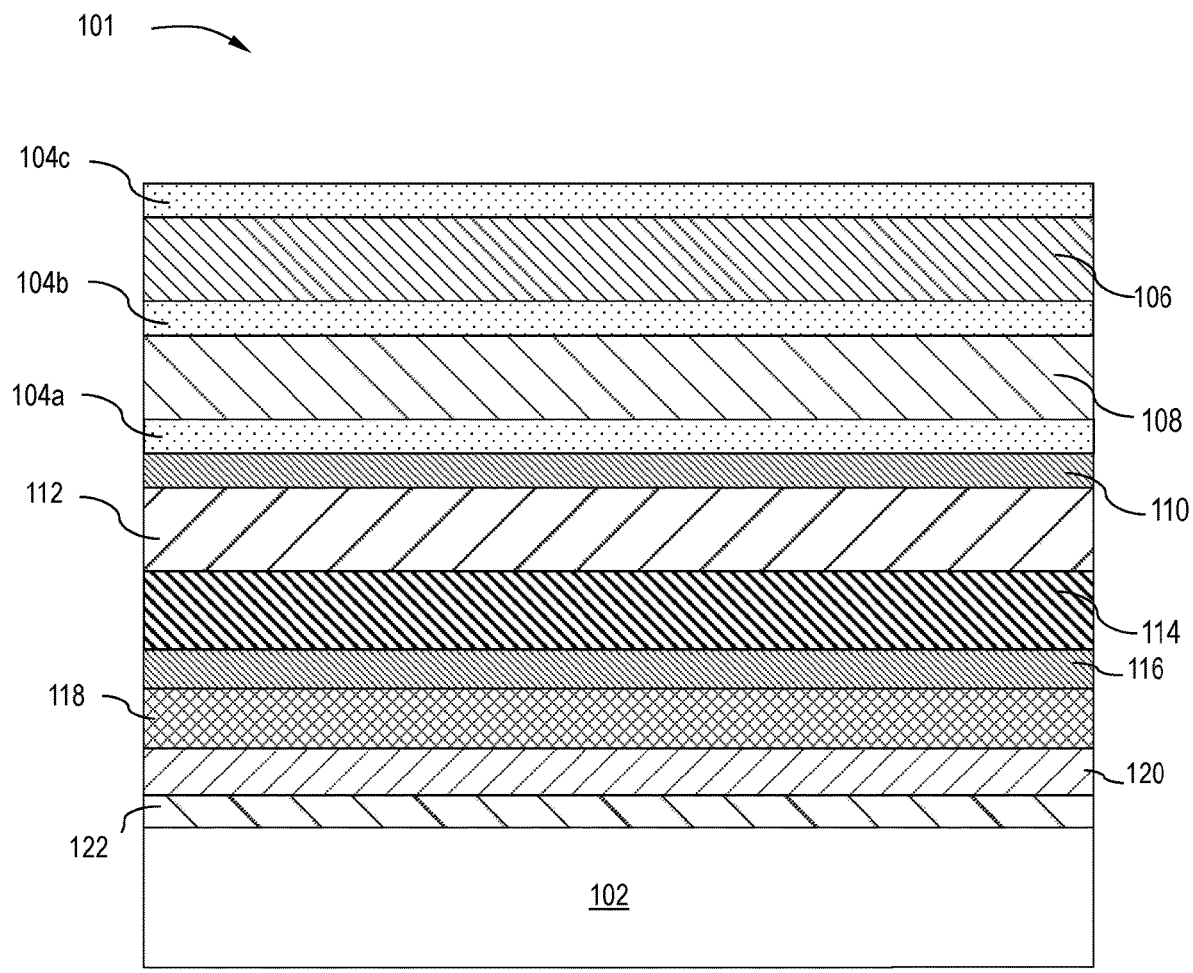
FIG. 1 illustrates a cross-sectional view of an LED device including multiple quantum wells according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "substrate" as used herein according to one or more embodiments refers to a structure, intermediate or final, having a surface, or portion of a surface, upon which a process acts. In addition, reference to a substrate in some embodiments also refers to only a portion of the substrate, unless the context clearly indicates otherwise. Further, reference to depositing on a substrate according to some embodiments includes depositing on a bare substrate or on a substrate with one or more layers, films, features or materials deposited or formed thereon.

In one or more embodiments, the "substrate" means any substrate or material surface formed on a substrate upon which film processing is performed during a fabrication process. In exemplary embodiments, a substrate surface on which processing is performed includes materials such as silicon, silicon oxide, silicon on insulator (SOI), strained silicon, amorphous silicon, doped silicon, carbon doped silicon oxides, germanium, gallium arsenide, glass, sapphire, and any other suitable materials such as metals, metal nitrides, III-nitrides (e.g., GaN, AN, InN and other alloys), metal alloys, and other conductive materials, depending on the application. Substrates include, without limitation, light emitting diode (LED) devices. Substrates in some embodiments are exposed to a pretreatment process to polish, etch, reduce, oxidize, hydroxylate, anneal, UV cure, e-beam cure and/or bake the substrate surface. In addition to film processing directly on the surface of the substrate itself, in some embodiments, any of the film processing steps disclosed is also performed on an underlayer formed on the substrate, and the term "substrate surface" is intended to include such underlayer as the context indicates. Thus for example, where a film/layer or partial film/layer has been deposited onto a substrate surface, the exposed surface of the newly deposited film/layer becomes the substrate surface.

The term "wafer" and "substrate" will be used interchangeably in the instant disclosure. Thus, as used herein, a wafer serves as the substrate for the formation of the LED devices described herein.

Embodiments described herein describe LED devices and methods for forming LED devices. In particular, the present disclosure describes LED devices and methods to produce LED devices which advantageously have two or more groups of quantum wells (QWs) grown in the same epitaxial wafer. In one or more embodiments, only a first group of QWs with shortest emission wavelength is placed between the p- and n-layers of a p-n junction. Other groups of QWs with longer wavelengths are placed outside the p-n junction in a part of the LED structure where electrical injection of minority carriers does not occur. Electroluminescence emitted by the first group of QWs is absorbed by other group(s) and re-emitted as longer wavelength light. The color of an individual die made on the wafer can be controlled by either etching away unwanted groups of longer-wavelength QWs at the position of that die, or keeping them intact as will be discussed below. In one or more embodiments, wavelength-selective mirrors that increase down conversion efficiency may be selectively applied to the die where longer wavelength emission is desired. In one or more embodiments, the use of tunnel junction contacts facilitates integration of wavelength selective mirrors to external surfaces of the die and avoids problems of conductivity type conversion on etched p-GaN layers. The use of tunnel junction contacts further relaxes requirements on the conductivity type of the PL-emitting QW group(s) and allows them to be grown at the end of the epitaxy run minimizing the thermal load placed on said QWs by growing other layers of the LED structure.

In one or more embodiments, monolithically integrating LEDs of different colors in the same wafer provides advantages compared to a making displays in the conventional method using three wafers of different colors. In one or more embodiments, the number of separate epitaxy recipes which must be manufactured to produce source die for uLED displays is advantageously reduced compared to existing methods, reducing cost and complexity in the epi manufacturing stage. Existing methods require production of separate blue, green, and red recipes.

In one or more embodiments, the number of pick and place operations required to populate a display is reduced, since arrays of pixels can be transferred together, instead of only one color type pixel at a time. Fewer pick and place operations will advantageously lead to cost and throughput improvements at the display assembly stage.

Some embodiments eliminate entirely the need for pick and place and instead allow whole wafer-level transfer of pixels onto a display since one wafer can contain all 3 required colors. The entire processed wafer or a large piece of it could be incorporated directly into the display.

In one or more embodiments, because the color conversion layers are already built-in to the wafer during epitaxial growth, separate post-epitaxy processing steps to add color conversion materials are not required. Fundamental technical difficulties associated with (for example) accurately coating color-converting quantum dots into micron-sized spaces are, thus, avoided. Additionally, in one or more embodiments, the efficiency of green or red-emitting LEDs can potentially be higher than that of conventional LEDs of the same color, particularly for high drive current densities.

In one or more embodiments, the growth of only one tunnel junction and one p-GaN layer to produce three colors is required. Accordingly, the epitaxial growth is less complex versus other epitaxial growth methods utilizing tunnel junctions to produce LEDs of different colors on the same wafer.

The embodiments of the disclosure are described by way of the Figures, which illustrate devices (e.g. transistors) and processes for forming devices in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure are described with reference to the Figures. FIGS. 1 through 8 illustrate cross-sectional views of a device 100 according to one or more embodiments. An aspect of the disclosure pertains to a method of manufacturing a LED array. Referring to FIG. 1, a LED device 100 is manufactured containing two or more groups of quantum wells of different emission wavelengths in the same wafer. In one or more embodiments, a first group of quantum wells (with shortest emission wavelength) is located between a p-type layer and a first n-type layer which forms a p-n junction with the p-type layer. In one or more embodiments, a tunnel junction connects the p-layer of the p-n junction with a second n-type layer at a different position in the epitaxy stack versus the first n-type layer. In one or more embodiments, second and third groups of quantum wells with longer emission wavelengths are located within the second n-type layer placed between them and the p-n junction. In one or more embodiments, a tunnel junction connects the p-layer of the p-n junction with the second n-type layer.

In one or more embodiments, the first part of the epitaxy involves the growth of a nucleation layer 122, a defect reduction layer 120, and an n-type layer 118 and may be the same as in a conventional LED growth run using a sapphire or other applicable growth substrate 102. In one or more embodiments, the n-type layer 118 may comprise an n-type current spreading layer.

The substrate 102 may be any substrate known to one of skill in the art which is configured for use in the formation of LED devices. In one or more embodiments, the substrate 102 comprises one or more of sapphire, silicon carbide, silica (Si), quartz, magnesium oxide (MgO), zinc oxide (ZnO), spinel, and the like. In one or more embodiments, the substrate 102 is a transparent substrate. In specific embodiments, the substrate 102 comprises sapphire. In one or more embodiments, the substrate 102 is not patterned prior to formation of the LEDs. Thus, in some embodiments, the substrate is 102 not patterned and can be considered to be flat or substantially flat. In other embodiments, the substrate 102 is a patterned substrate.

In one or more embodiments, the n-type layer 118 may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type layer 118 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type layer 118 comprises gallium nitride (GaN). In one or more embodiments, the n-type layer 118 is doped with n-type dopants, such as silicon (Si) or germanium (Ge). The n-type layer 118 may have a dopant concentration significant enough to carry an electric current laterally through the layer.

In one or more embodiments, the layers of III-nitride material which form the first LED, the second LED and the third LED are deposited by one or more of sputter deposition, atomic layer deposition (ALD), metalorganic chemical vapor deposition (MOCVD), physical vapor deposition (PVD), plasma enhanced atomic layer deposition (PEALD), and plasma enhanced chemical vapor deposition (PECVD).

"Sputter deposition" as used herein refers to a physical vapor deposition (PVD) method of thin film deposition by sputtering. In sputter deposition, a material, e.g. a III-nitride, is ejected from a target that is a source onto a substrate. The technique is based on ion bombardment of a source material, the target. Ion bombardment results in a vapor due to a purely physical process, i.e., the sputtering of the target material.

As used according to some embodiments herein, "atomic layer deposition" (ALD) or "cyclical deposition" refers to a vapor phase technique used to deposit thin films on a substrate surface. The process of ALD involves the surface of a substrate, or a portion of substrate, being exposed to alternating precursors, i.e. two or more reactive compounds, to deposit a layer of material on the substrate surface. When the substrate is exposed to the alternating precursors, the precursors are introduced sequentially or simultaneously. The precursors are introduced into a reaction zone of a processing chamber, and the substrate, or portion of the substrate, is exposed separately to the precursors.

As used herein according to some embodiments, "chemical vapor deposition" refers to a process in which films of materials are deposited from the vapor phase by decomposition of chemicals on a substrate surface. In CVD, a substrate surface is exposed to precursors and/or co-reagents simultaneous or substantially simultaneously. A particular subset of CVD processes commonly used in LED manufacturing use metalorganic precursor chemical and are referred to as MOCVD or metalorganic vapor phase epitaxy (MOVPE). As used herein, "substantially simultaneously" refers to either co-flow or where there is overlap for a majority of exposures of the precursors.

As used herein according to some embodiments, "plasma enhanced atomic layer deposition (PEALD)" refers to a technique for depositing thin films on a substrate. In some examples of PEALD processes relative to thermal ALD processes, a material may be formed from the same chemical precursors, but at a higher deposition rate and a lower temperature. In a PEALD process, in general, a reactant gas and a reactant plasma are sequentially introduced into a process chamber having a substrate in the chamber. The first reactant gas is pulsed in the process chamber and is adsorbed onto the substrate surface. Thereafter, the reactant plasma is pulsed into the process chamber and reacts with the first reactant gas to form a deposition material, e.g. a thin film on a substrate. Similarly to a thermal ALD process, a purge step may be conducted between the deliveries of each of the reactants.

As used herein according to one or more embodiments, "plasma enhanced chemical vapor deposition (PECVD)" refers to a technique for depositing thin films on a substrate. In a PECVD process, a source material, which is in gas or liquid phase, such as a gas-phase III-nitride material or a vapor of a liquid-phase III-nitride material that have been entrained in a carrier gas, is introduced into a PECVD chamber. A plasma-initiated gas is also introduced into the chamber. The creation of plasma in the chamber creates excited radicals. The excited radicals are chemically bound to the surface of a substrate positioned in the chamber, forming the desired film thereon.

In one or more embodiments, a LED device 100 is manufactured by placing the substrate 102 in a metalorganic vapor-phase epitaxy (MOVPE) reactor so that the LED device layers are grown epitaxially.

In one or more embodiments, a nucleation layer 122 is formed on the substrate 102 prior to the defect reduction layer 120. In one or more embodiments, the nucleation layer comprises a III-nitride material. In specific embodiments, the nucleation layer 122 comprises gallium nitride (GaN) or aluminum nitride (AlN).

In one or more embodiments, a plurality of electroluminescence emitting quantum wells 114 is grown on the current spreading layer 108, with a dilute indium concentration layer(s) 116 optionally grown before the electroluminescence emitting quantum wells 114. In one or more embodiments, the electroluminescence emitting quantum wells 114 may be doped with n-type doping.

The electroluminescence emitting quantum wells 114 may be formed using any deposition technique known to one of skill in the art. The electroluminescence emitting quantum wells 114 may comprise a sequence of multiple quantum wells emitting the same wavelength of light. In one or more embodiments, the electroluminescence emitting quantum wells 114 emit light having a wavelength in a range of from about 410 nm to about 495 nm. The electroluminescence emitting quantum wells 114 may comprise different layers of indium gallium nitride (InGaN) and gallium nitride (GaN). The emission color may be controlled by the relative mole fractions of indium (In) and gallium (Ga) in the InGaN layer and/or by the thicknesses of the multiple quantum wells.

In one or more embodiments, an individual quantum well within the electroluminescence emitting quantum wells 114 may have an InGaN thickness in a range of from about 0.5 nm to about 10 nm and a GaN barrier thickness in a range of from about 2 nm to about 100 nm. The total number of quantum wells in the electroluminescence emitting quantum wells 114 may be in a range of from 1 to 50.

In one or more embodiments, after the growth of the electroluminescence emitting quantum wells 114, electron blocking layers and p-type layers 112 are grown using deposition techniques known to one of skill in the art. In one or more embodiments, the p-type layers 112 comprise gallium nitride (GaN).

After completing the p-type layer 112 of the LED, the growth conditions are then changed to grow a tunnel junction 110. In one or more embodiments, the tunnel junction 110 may be similar to, but is not limited to, tunnel junctions known to one of skill in the art. After the growth of the tunnel junction 110, an n-type layer 104 is grown on the tunnel junction 110. The n-type layer 104 may be thin, or it could be much thicker with thickness in the tens or hundreds of nanometers.

In one or more embodiments, the doping concentration of the n-type layer 104 may be high enough to facilitate formation of ohmic contacts with common metals such as Al, but the doping concentration of the n-type layer 104 need not be as high as that of the tunnel junction 110. In one or more embodiments, the n-type layer 104 could have a graded doping concentration or it could be divided into several sections with different doping concentrations.

After formation of the n-type layer 104, a group of photoluminescence quantum wells 108 is grown. In one or more embodiments, the photoluminescence quantum wells 108 emit light having a wavelength in a range of from about 460 nm to about 570 nm. In one or more embodiments, the design of the photoluminescence quantum wells 108 may differ from the active region of a conventional green LED in that the n-type doping concentration and the number of wells may be different, among other possible differences. In one or more embodiments, the doping concentration in the photoluminescence quantum wells 108 is set high enough to avoid a significant voltage drop when this layer is part of the LED circuit. Subsequently, a second n-type layer 104 is grown on the photoluminescence quantum wells 108. The second n-type layer 104b has the same doping requirements as first n-type layer 104a, but the first n-type layer 104a and the second n-type layer 104b may have different thicknesses.

In one or more embodiments, a second group of photoluminescence quantum wells 106 is grown on a top surface of the second n-type layer 104b. In one or more embodiments, the photoluminescence quantum wells 106 emit light having a wavelength in a range of from about 600 nm to about 750 nm. In one or more embodiments, the design of the photoluminescence quantum wells 106 may differ from the active region of a conventional (red) LED in that the n-type doping concentration and the number of wells may be different, among other possible differences. Finally, a third n-type layer 104c may be grown over the photoluminescence quantum wells 106. The third n-type layer 104c has the same doping requirements as first n-type layer 104a and the second n-type layer 104b, but the first n-type layer 104a, the second n-type layer 104b, and the third n-type layer 104c may have different thicknesses.

It should be noted that the positions of photoluminescence quantum wells 108 and the photoluminescence quantum wells 106 within the epitaxy stack 101 could be interchanged in one or more embodiments. In one or more embodiments, locating the photoluminescence quantum wells 108 closer to the p-n junction (the arrangement illustrated in FIG. 1) has the advantage that light emitted by photoluminescence quantum wells 108 in the direction of the substrate cannot be absorbed by the photoluminescence quantum wells 106, thus increasing the green LED efficiency. It has the disadvantage, however, that blue electroluminescence is absorbed in the photoluminescence quantum wells 108 before it reaches the photoluminescence quantum wells 106, which may reduce the red LED efficiency. The absorption coefficient of green light in the photoluminescence quantum wells 106 is not necessarily high. Depending on the internal quantum efficiency (IQE) values and absorption coefficients of the photoluminescence quantum wells 106 and photoluminescence quantum wells 108, an arrangement with the positions of QWs interchanged versus that depicted in FIG. 1 may be favorable for some applications.

Figure 2:
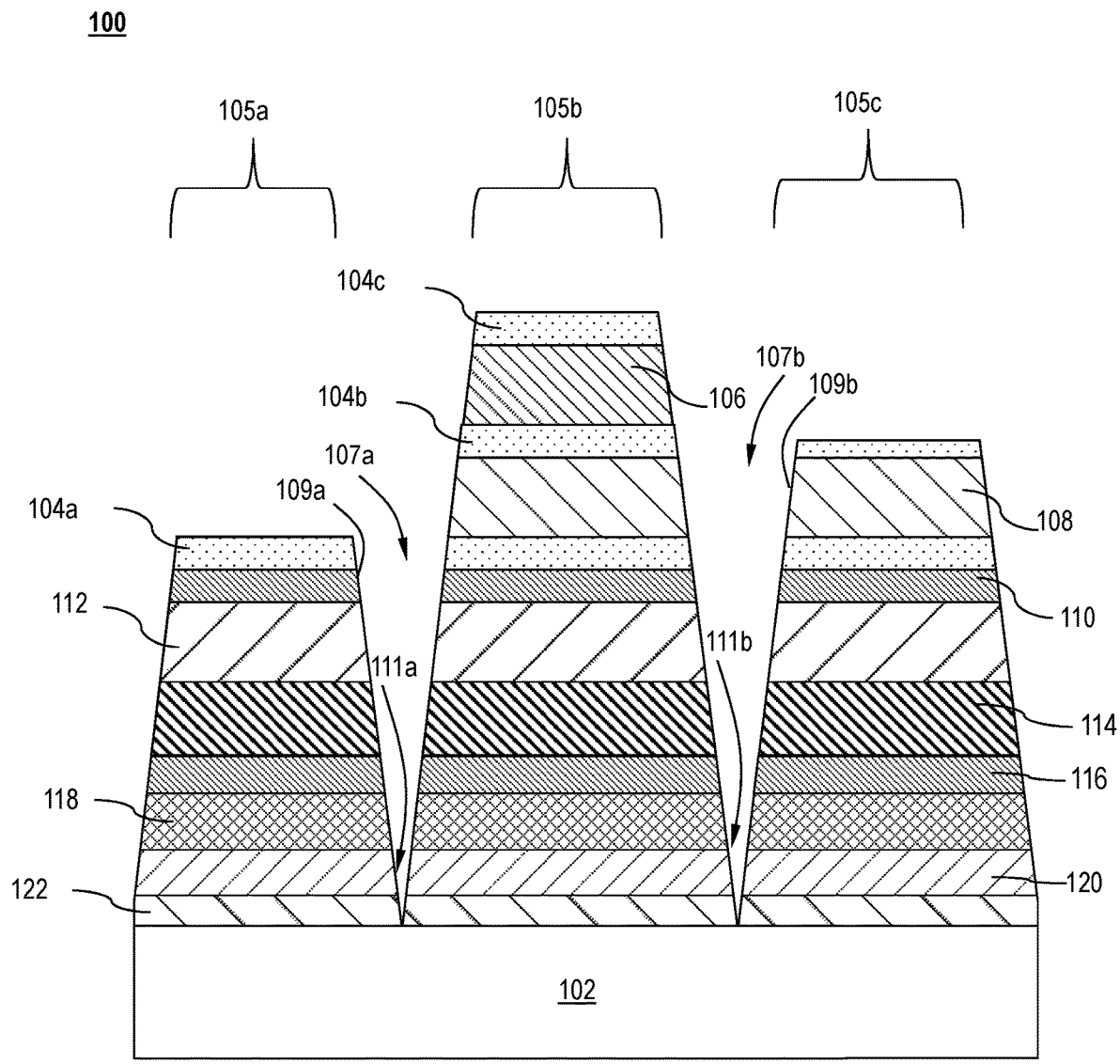
FIG. 2 illustrates a cross-sectional view of an LED device including multiple quantum wells according to one or more embodiments.

Referring to FIG. 2, a plurality of subpixels is formed by etching a first subpixel 105a, a second subpixel 105b, and a third subpixel 105c into the wafer 101. In one or more embodiments, the first subpixel 105a and the second subpixel 105b are separated by a trench 107a. In some embodiments, the trench 107a may be formed using a conventional directional etching process, such as dry etching. The trench 107a may be any suitable depth and may extend from the top surface of the third n-type layer 104c through the nucleation layer 122 to the substrate 102. The trench 107a may comprise at least one sidewall 109a and a bottom surface 111a. In one or more embodiments, the second subpixel 105b and the third subpixel 105c are separated by a trench 107b. In some embodiments, the trench 107b may be formed using a conventional directional etching process, such as dry etching. The trench 107b may be any suitable depth and may extend from the top surface of the third n-type layer 104c through the nucleation layer 122 to the substrate 102. The trench 107b may comprise at least one sidewall 109b and a bottom surface 111b.

In one or more embodiments, the first subpixel 105a may have a height (thickness) that is less than the height (thickness) of the second subpixel 105b and less than the height (thickness) of the third subpixel 105c. In one or more embodiments, the third subpixel 105c may have a height (thickness) that is less than the height (thickness) of the second subpixel 105b.

In one or more embodiments, the etched surface (trench 107a, 107b) may have an angle of inclination up to 45 degrees. In some embodiments, the etched surface (trench 107a, 107b) may be completely vertical.

In one or more embodiments, the formation of the plurality of subpixels 105a, 105b, 105c involves an additional etching step compared to conventional LED manufacturing methods. In one or more embodiments, the additional etching step removes the first group of photoluminescent quantum wells 108 and the second group of photoluminescent quantum wells 106 at a first set of positions 105a on the substrate 102, removes the second group of photoluminescent quantum wells 106 at a second set of positions 105c on the substrate 102, and leaves unetched a third set of positions 105b on the substrate 102. The thickness of material that needs to be etched from the first set of positions 105a is thicker than that to be removed from the second set of positions 105c. The thickness difference may be accommodated either by separating the additional etch process into two separate etch steps, or by coating a sacrificial layer onto the second set of positions 105c to reduce the depth of material etched at those positions in a single etch step. Dry etching using process conditions which favor a high vertical/lateral etch rate may be used for the additional etching step. This additional etching step may be one of the first steps in the process, or it may come later in the process (for example, after the mesa etch to expose the n-layer under the p-n junction).

In one or more embodiments, the first subpixel 105a is a mesa comprising electroluminescence emitting quantum wells 114. More specifically, the first subpixel 105a comprises a first mesa including a first n-type layer 104a on a tunnel junction 110 on electron blocking layers and p-type layers 112. The p-type layers 112 are on electroluminescence emitting quantum wells 114. The electroluminescence emitting quantum wells may be on an optional dilute indium concentration layer 116 on an n-type layer 118, on a defect reduction layer 120, on a nucleation layer 122, on the substrate 102.

In one or more embodiments, the second subpixel 105b is a mesa comprising a first group of photoluminescent quantum wells 108 and a second group of photoluminescent quantum wells 106 on an electroluminescent quantum well 114. More specifically, the second subpixel 105b comprises a second mesa including a third n-type layer 104c on the second group of photoluminescent quantum wells 106, a second n-type layer 104b on the first group of photoluminescent quantum wells 108, a first n-type layer 104a on a tunnel junction 110 on electron blocking layers and p-type layers 112. The p-type layers 112 are on electroluminescence emitting quantum wells 114. The electroluminescence emitting quantum wells 114 may be on an optional dilute indium concentration layer 116 on an n-type layer 118, on a defect reduction layer 120, on a nucleation layer 122, on the substrate 102.

In one or more embodiments, the third subpixel 105c is a mesa comprising a first group of photoluminescent quantum wells 108 on an electroluminescent quantum well 114. More specifically, the third subpixel 105c comprises a third mesa including a second n-type layer 104b on the first group of photoluminescent quantum wells 108, a first n-type layer 104a on a tunnel junction 110 on electron blocking layers and p-type layers 112. The p-type layers 112 are on electroluminescence emitting quantum wells 114. The electroluminescence emitting quantum wells 114 may be on an optional dilute indium concentration layer 116 on an n-type layer 118, on a defect reduction layer 120, on a nucleation layer 122, on the substrate 102.

In one or more embodiments, a p-type layer activation annealing step may be performed after the plurality of subpixels are etched because it is difficult for hydrogen to pass through n-type layers 104a, 104b, 105c and annealing after the mesa etch allows hydrogen to escape laterally from the etched sidewalls.

Figure 3:
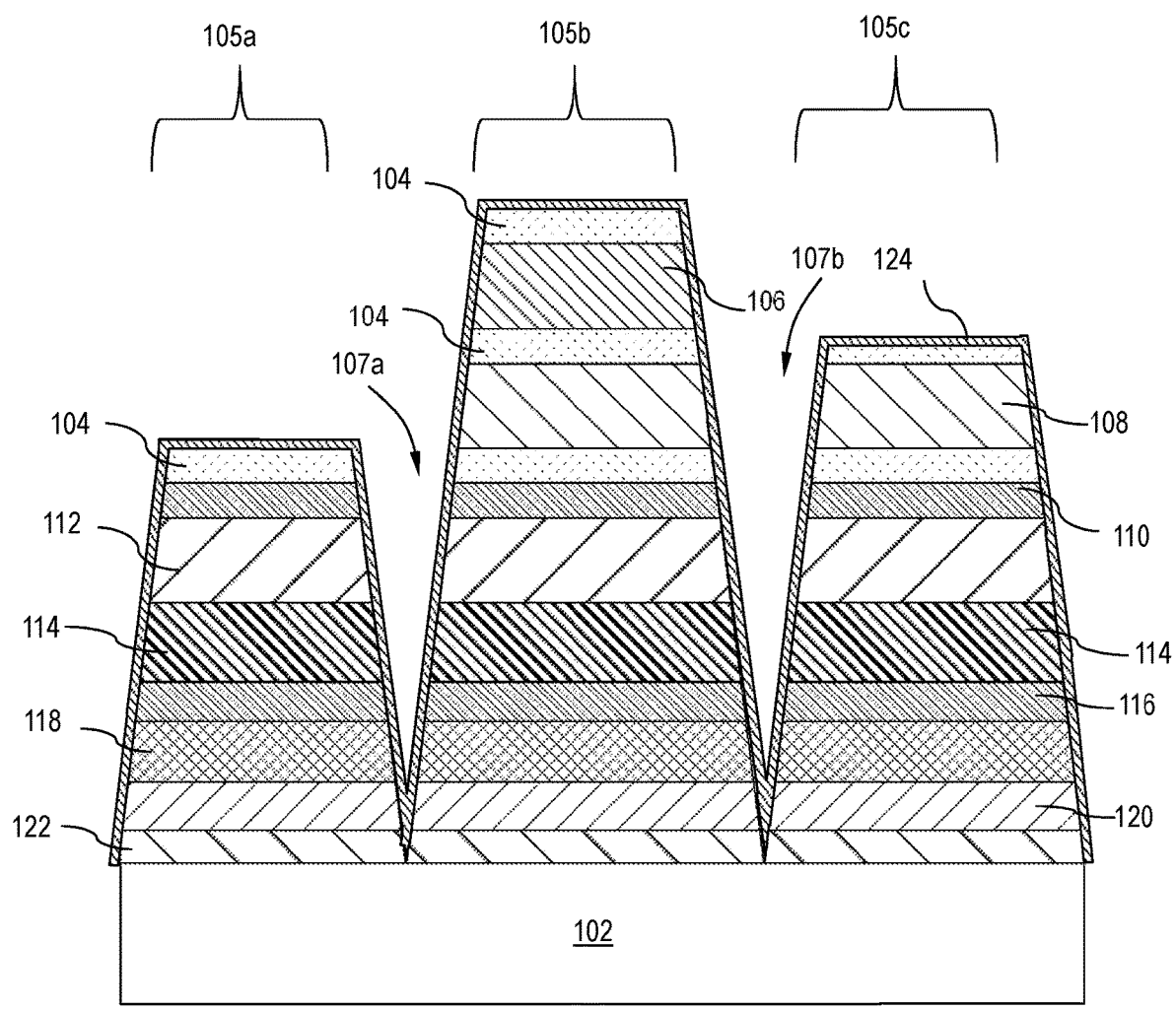
FIG. 3 illustrates a cross-sectional view of an LED device including multiple quantum wells according to one or more embodiments.

FIG. 3 shows formation of a dielectric layer 124 on the pluralities of subpixels 105a, 105b, 105c and in the trench 107a, 107b. The dielectric layer 124 may be formed using a conventional deposition technique, such as, for example, CVD, PECVD, ALD, evaporation, sputtering, chemical solution deposition, spin-on deposition, or other like processes.

As used herein, the term "dielectric" refers to an electrical insulator material that can be polarized by an applied electric field. In one or more embodiments, the dielectric layer 124 may comprise any suitable dielectric material known to the skilled artisan. In some embodiments, the dielectric material comprises one of more of silicon nitride (SiN), titanium oxide ($TiO_x$), niobium oxide ($NbO_x$), aluminum oxide ($AlO_x$), hafnium oxide ($HfO_x$), tantalum oxide ($TaO_x$), aluminum nitride (AlN), silicon oxide ($SiO_x$), and hafnium-doped silicon dioxide ($HfSiO_x$). While the term "silicon oxide" may be used to describe the dielectric layer 124, the skilled artisan will recognize that the disclosure is not restricted to a particular stoichiometry. For example, the terms "silicon oxide" and "silicon dioxide" may both be used to describe a material having silicon and oxygen atoms in any suitable stoichiometric ratio. In one or more embodiments, the dielectric layer 124 has a thickness greater than about 300 nm, or greater than about 500 nm, or greater than about 1000 nm.

In one or more embodiments, the dielectric layer 124 is substantially conformal. As used herein, a layer which is "substantially conformal" refers to a layer where the thickness is about the same throughout (e.g., on the top surface of each subpixel, on the at least one sidewall 109a, 109b, and on the bottom surface 111a, 111b of the trench 107a, 107b). A layer which is substantially conformal varies in thickness by less than or equal to about 5%, 2%, 1% or 0.5%.

Figure 4:
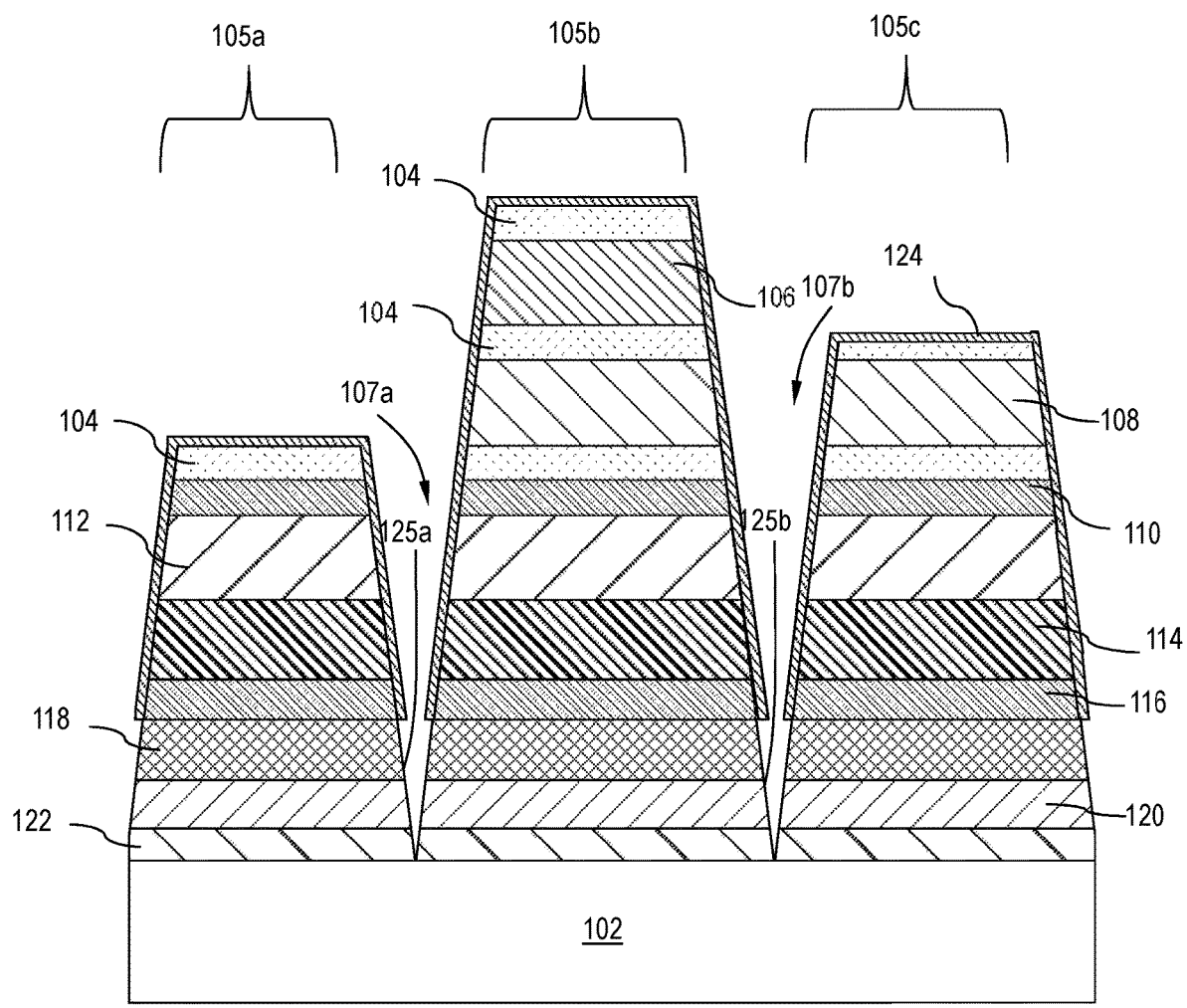
FIG. 4 illustrates a cross-sectional view of an LED device including multiple quantum wells according to one or more embodiments.

In some embodiments, the dielectric layer 124 forms on the bottom surface 111a, 111b of the trench 107. In other embodiments, the dielectric layer 124 is not on the bottom surface 111a, 111b of the trench 107a, 107b and the substrate 102 is exposed on the bottom surface of the trench 107a, 107b. Referring to FIG. 4, portions of the dielectric layer 124 may be removed from the bottom surface 111a, 111b and at least one sidewall 109a, 109b of the trench 107a, 107b. The portions of the dielectric layer 124 may be removed using a conventional directional etching process, such as dry etching. In one or more embodiments, when portions of the dielectric layer 124 are removed from the bottom surface 111a, 111b and at least one sidewall 109a, 109b of the trench 107a, 107b, an exposed portion 125a, 125*b* is formed. The exposed portion 125*a*, 125*b* may include portions of the n-type layer 118, the defect reduction layer 120, the nucleation layer 122, and the substrate 102 may be exposed in the trench 107*a*, 107*b*.

Figure 5:
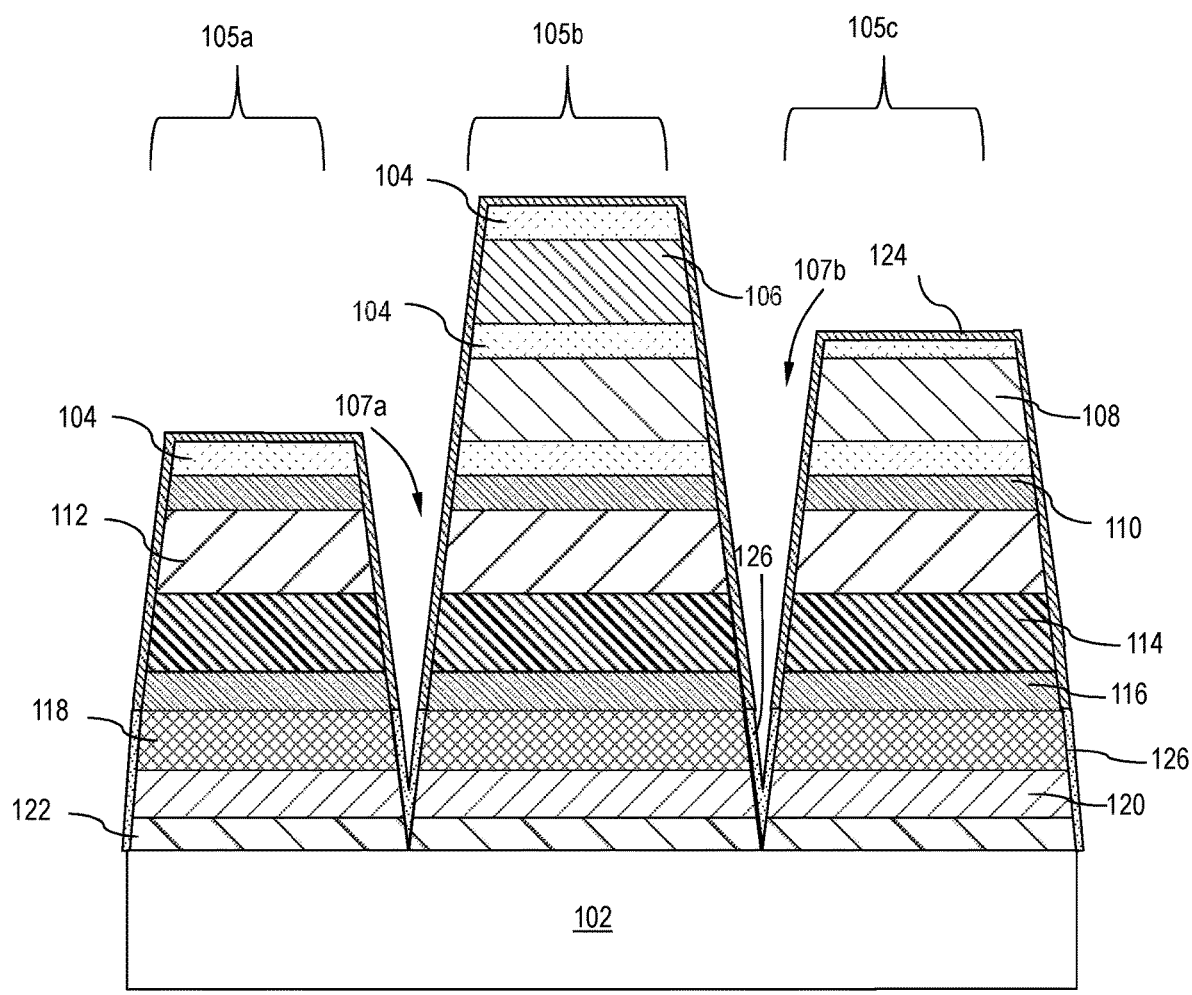
FIG. 5 illustrates a cross-sectional view of an LED device including multiple quantum wells according to one or more embodiments.

Referring to FIG. 5, in one or more embodiments, a cathode contact metal 126, or an n-type contact, is deposited on the exposed portion 125 in the trench 107*a*, 107*b*. The LEDs in the array may, thus, share a common n-contact electrode as depicted in FIG. 6A. In one or more embodiments, the cathode contact metal 126 may comprise any suitable material known to the skilled artisan. In one or more embodiments, the cathode contact metal 126 comprises an n-contact material selected from one or more of aluminum (Al), titanium (Ti), and chromium (Cr).

Figure 6:
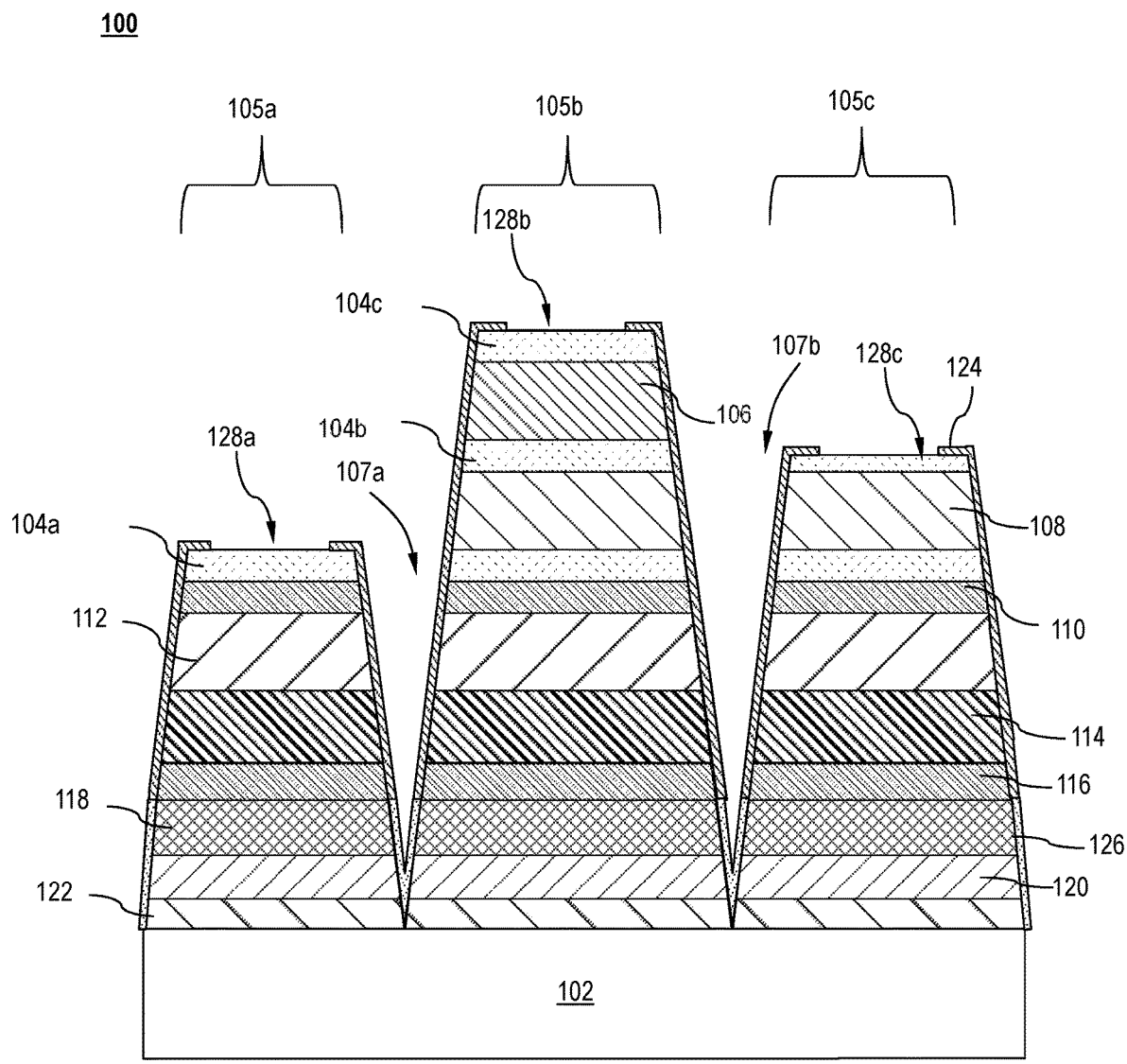
FIG. 6 illustrates a cross-sectional view of an LED device including multiple quantum wells according to one or more embodiments.

FIG. 6 shows formation of a contact hole 128 in the dielectric layer 124, exposing a top surface of the n-type layer 104 In some embodiments a first contact hole 128*a* is formed in the dielectric layer 124 of the first subpixel 105*a*, exposing a top surface of the first n-type layer 104*a*. A second contact hole 128*b* may be formed in the dielectric layer 124 of the second subpixel 105*b*, exposing a top surface of the third n-type layer 104*c*. A third contact hole 128*c* may be formed in the dielectric layer 124 of the third subpixel 105*c*, exposing a top surface of the second n-type layer 104*b*. The contact hole 128*a*, 128*b*, 128*c* may be formed using a conventional directional etching process, such as dry etching.

Figure 7:
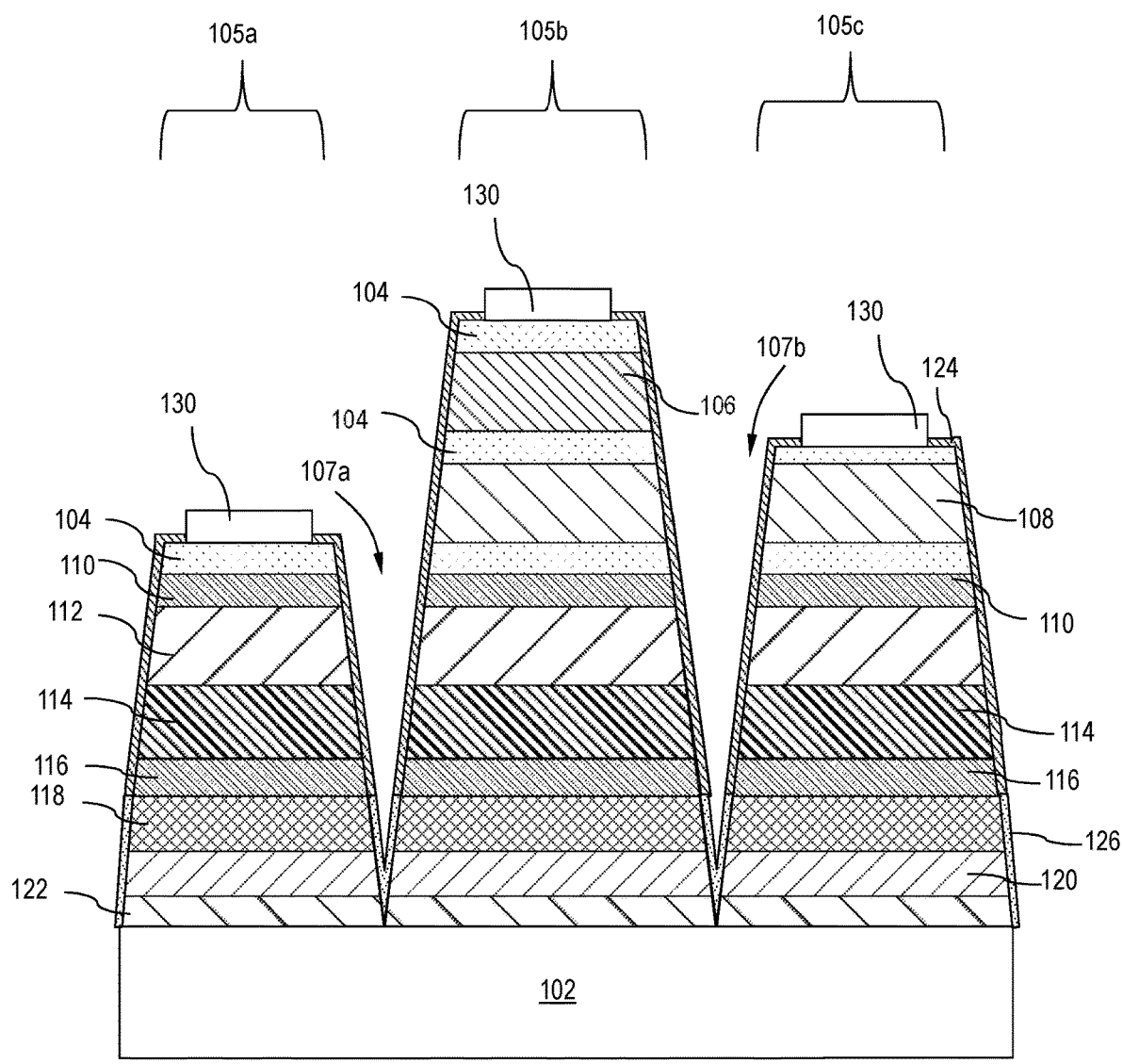
FIG. 7 illustrates a cross-sectional view of an LED device including multiple quantum wells according to one or more embodiments.

Referring to FIG. 7, an anode contact metal 130 is deposited in the contact hole 128. In one or more embodiments, the anode contact metal 130 may comprise any suitable material known to the skilled artisan. In one or more embodiments, the anode contact metal 130 comprises a p-contact material selected from one or more of aluminum (Al), silver (Ag), gold (Au), platinum (Pt), and palladium (Pd). In specific embodiments, the anode contact metal 130 comprises silver (Ag). In some embodiments, additional metals may be added in small quantities to the anode contact metal as adhesion promoters. Such adhesion promoters, include, but are not limited to, one or more of nickel (Ni), titanium (Ti), and chromium (Cr).

In one or more embodiments, the anode contact 130 and the cathode contact 126 may be made with the same metal in the same deposition and lift-off steps.

The dielectric passivation layer 124 is shown as a single layer in the Figures, but it could alternatively be implemented as a multilayer coating of high and low refractive index materials with thicknesses optimized for maximum reflectivity in blue wavelengths. If implemented as a single layer, the optical thickness of the dielectric passivation layer 124 may be co-optimized with the cathode metal 126 to maximize reflectivity at blue wavelengths. The cathode contact 126 may be made to the n-type layer on the sides of the mesas 105*a*, 105*b*, 105*c*, making possible the use of a single mesa etch step to isolate the LEDs from each other and expose the cathode contact for metallization.

Figure 8:
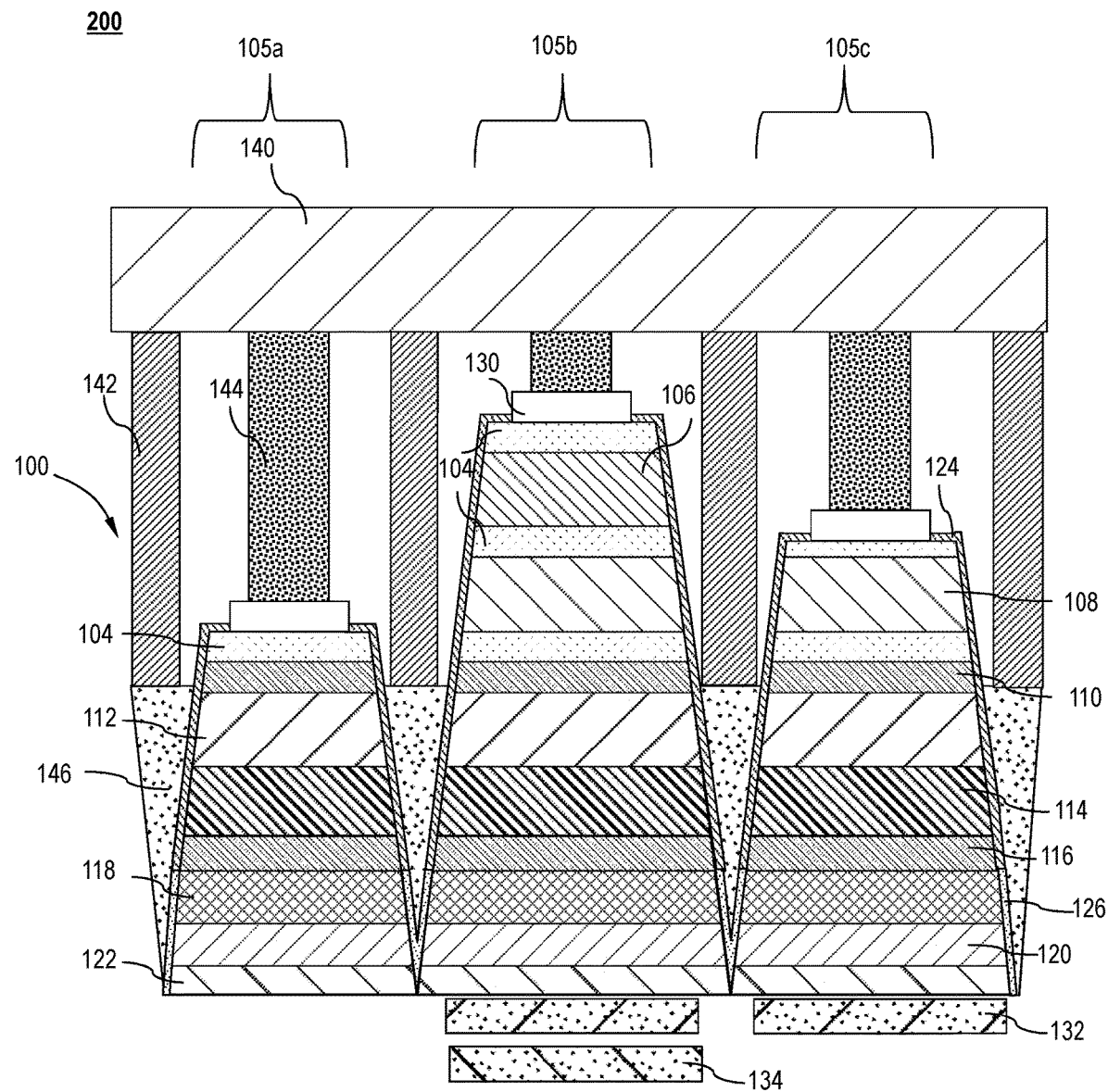
FIG. 8 illustrates a cross-sectional view of system according to one or more embodiments.

In later stages of processing, the spaces between the mesas 105*a*, 105*b*, 105*c* are filled with an electrically conductive material 146, which could be, for example, electroplated copper (Cu). The entire wafer 100 or a piece of the wafer 100, which could be as small as an individual pixel containing three microLED sub-pixels, are bonded to a system substrate 140 such as a display backplane to form a system 200. An array of landing pads 142, 144 is arranged on the system substrate 140 with dimensions aligned to those of the bonding pads on the LED wafer 100. The landing pads 142, 144 may be connecting to display driver circuitry in the system substrate 140. The landing pads 142, 144 may include sub-pixels of different heights to accommodate the differences in heights of the LEDs on the wafer, as shown in FIG. 8. Alternatively, the landing pads 142, 144 may be made from a material that is soft enough to accommodate the height differences by mechanical deformation in the bonding process. In one or more embodiments, the bonding mechanism may be based on application of pressure, localized heating, or a combination of the two.

Referring to FIG. 8, n one or more embodiments, after bonding, the growth substrate 102 is removed using a process such as laser lift-off if the substrate is a UV-transparent material such as sapphire. Other types of growth substrate may be removed by selective chemical etching. In one or more embodiments, wavelength selective reflector coatings 132, 134 are applied to the exposed surfaces of the sub-pixels 105*b*, 105*c* to prevent color contamination of those pixels with shorter wavelength light that is not completely absorbed in the QWs of longer wavelength. In some embodiments, the wavelength selective reflector coatings 132, 134 may comprise dichroic mirrors.

In one or more specific embodiments, the wavelength selective reflector coating 132 for the third sub-pixel 105*c* may be a distributed Bragg reflector (DBR) consisting of a repeated stack of dielectric materials with high and low refractive indices and thicknesses optimized to maximize reflectivity at the blue electroluminescence peak wavelength. In one or more embodiments, the second sub-pixel 105*b* may use two connected distributed Bragg reflectors (DBR) optimized for high reflectivity at blue and green wavelengths, respectively, as wavelength selective reflector coatings 132, 134. In one or more embodiments, the wavelength selective reflector coatings 132, 134 may be patterned by lithographic methods, or using shadow masks if the sub-pixel dimensions are large enough.

In one or more embodiments, the growth substrate 102 comprises an optically transparent material such as, but not limited to, sapphire, magnesium oxide (MgO), quartz, and the like. A much shallower mesa etch may be used, not extending all the way to the substrate, and the requirement for a filler material 146, such as electrodeposited Cu, to planarize the surface after mesa etching can be avoided. In one or more embodiments, these differences may simplify the requirements for landing pads 142, 144 on the receiver substrate, though some small height differences may still need to be accommodated. In one or more embodiments, the substrate 102 may be thinned and optically polished before bonding, but is not removed after bonding. In one or more embodiments, after deposition and patterning of the wavelength-selective coatings 132, 134, an opaque grid may be coated over the substrate to prevent optical cross talk between sub-pixels.

Figure 9:
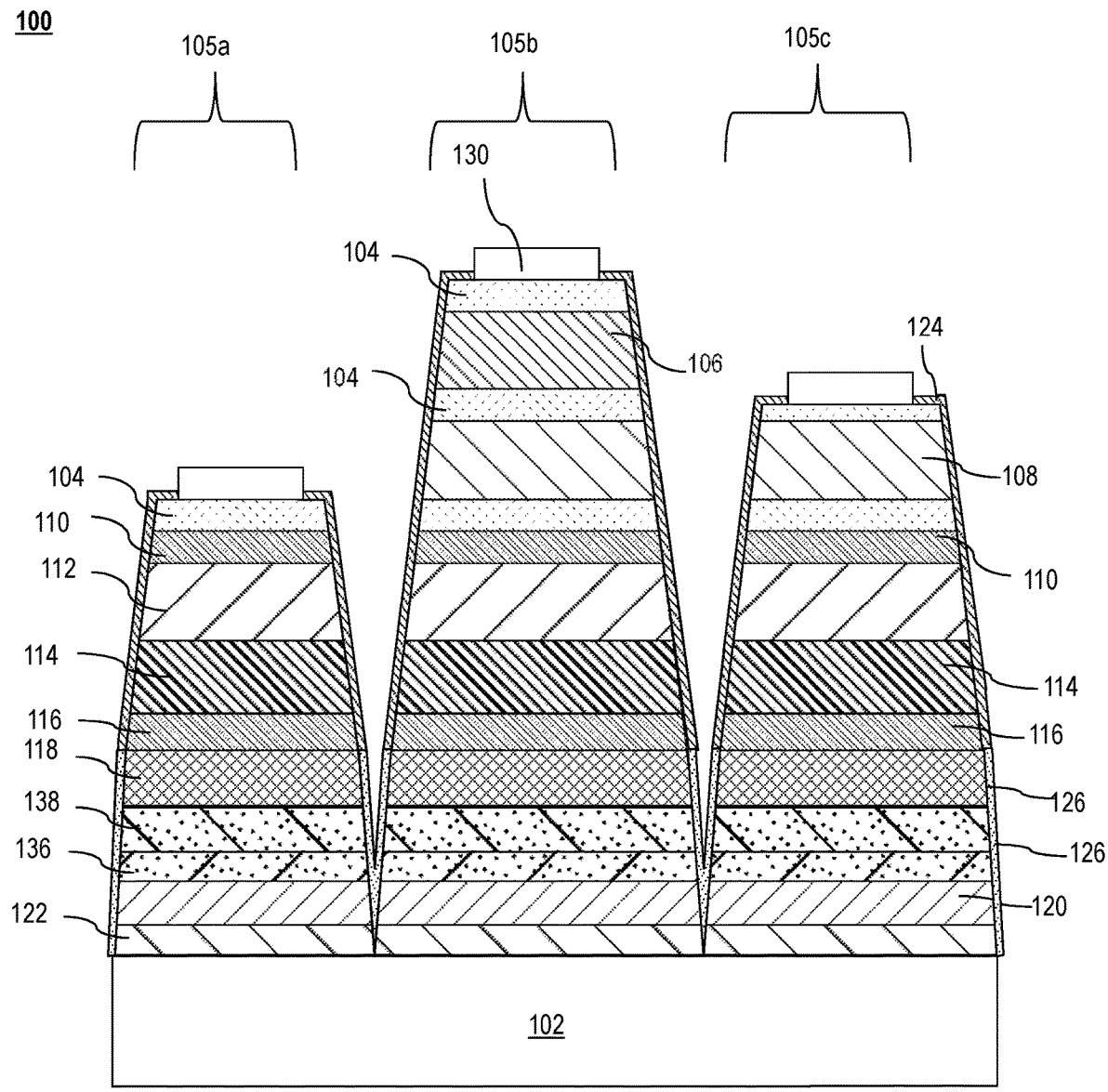
FIG. 9 illustrates a cross-sectional view of an LED device including multiple quantum wells according to one or more embodiments.

FIG. 9 illustrates an alternative embodiment. The epitaxial growth illustrated in FIG. 9 differs slightly from that of FIGS. 1 through 8. Referring to FIG. 9, in one or more embodiments, two epitaxial reflectors 136, 138 are grown before the n-type layer 118 that is under the p-n junction. The epitaxial reflectors 136, 138 may be dichroic mirrors in some embodiments. In specific embodiments, the epitaxial reflectors 136, 138 may be distributed Bragg reflectors (DBR) comprised of a sequence of alternating layers III-nitride materials with different refractive indices, such as, but not limited to, gallium nitride (GaN) and aluminum gallium nitride (AlGaN) or aluminum indium nitride (AlInN), or mixtures thereof. In one or more embodiments, implementations in which post-growth processing to oxidize or introduce porosity into one of the materials of the DBR to decrease its refractive index are also possible. In one or more embodiments, the period of the first epitaxial DBR 136 is selected to maximum reflectivity at the green photoluminescence wavelength. The period of the second epitaxial DBR 138 is selected to maximize reflectivity at the blue electroluminescence wavelength.

Figure 10:
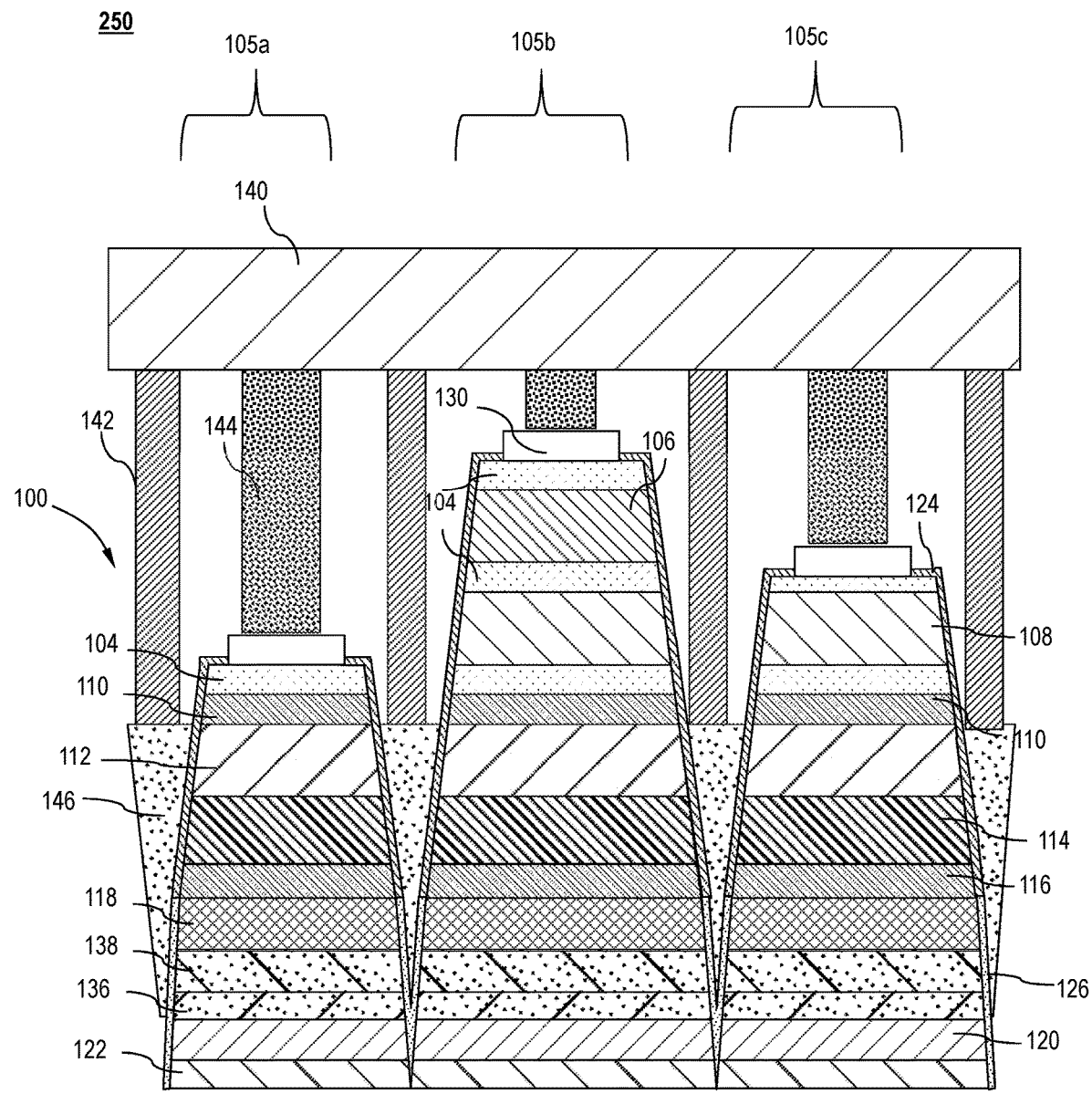
FIG. 10 illustrates a cross-sectional view of system according to one or more embodiments.
Figure 11:
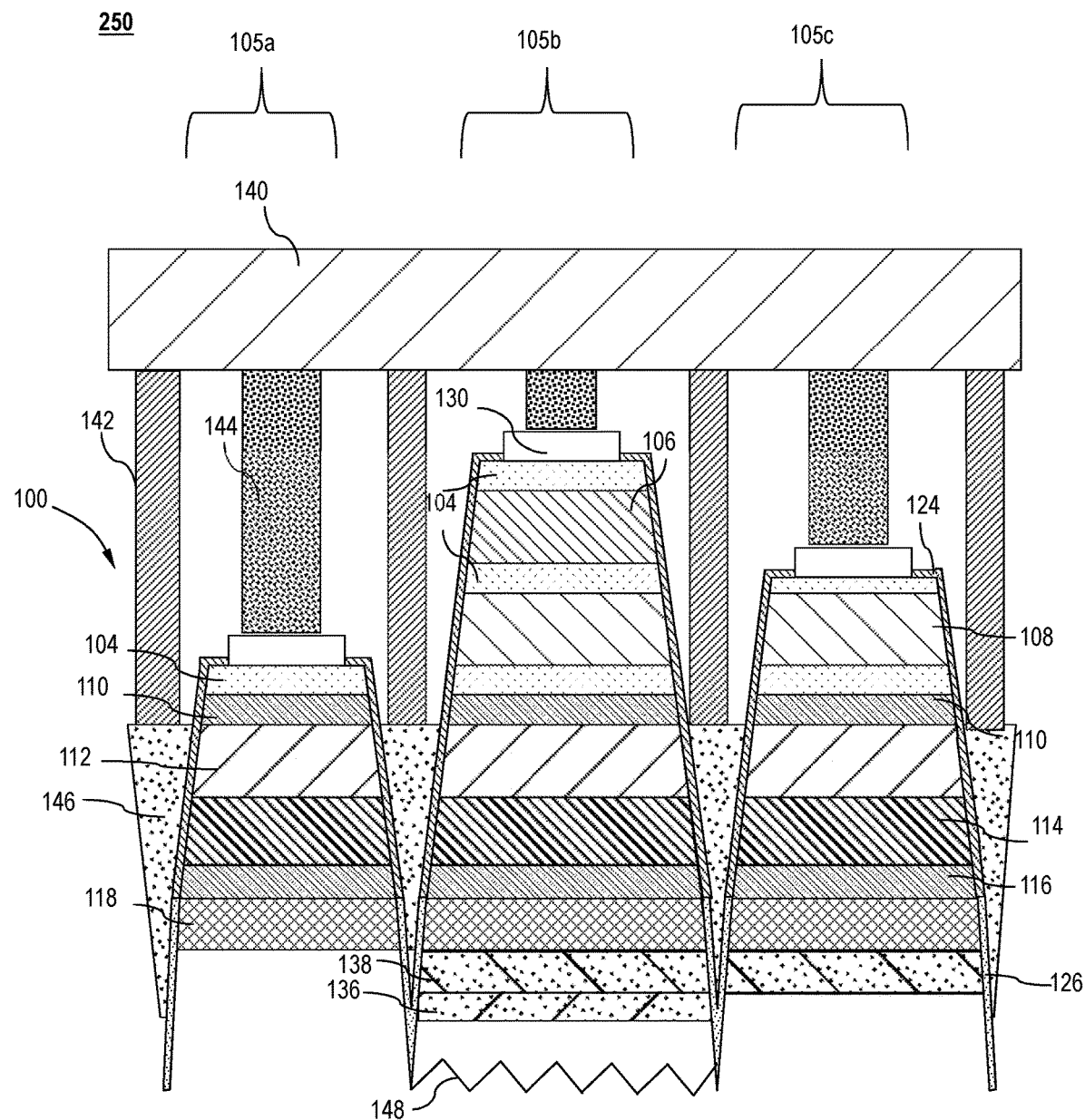
FIG. 11 illustrates a cross-sectional view of system according to one or more embodiments.

Referring to FIG. 10, bonding to a system substrate 140 is carried out as described with respect to FIG. 8. With reference to FIG. 11, in one or more embodiments, the wafer 100 may be subjected to an etching step after substrate 102 removal, corresponding to the same stage of the process where deposition of wavelength selective reflective coatings 132, 132 was performed in FIG. 8. In one or more embodiments, both of the epitaxial DBRs 136, 138 are etched away for the first sub-pixel 105a, only the first epitaxial DBR 136 is etched away for the third sub-pixel 105c, and no etching is done for the second sub-pixel 105b. In other words the patterning of external reflector coatings as discussed with reference to FIG. 8 is replaced by position-selective etching of reflectors built into the epitaxy. In one or more embodiments, the embodiment represented in FIGS. 9 through 10 has the advantage that the exposed GaN surface may be textured using maskless photoelectrochemical or masked dry etching methods to increase light extraction efficiency. With reference to FIG. 11, only the second sub-pixel 105b is textured 148, but texturing could be extended to all three sub-pixels 105a, 105b, 105c by including a sufficiently thick GaN layer in between the first and second epitaxial DBRs 136, 138 so that it can be textured after selective etch of the first DBR in the third sub-pixel 105c, and by texturing the n-type layer 118, which is exposed for the first sub-pixel 105a.

Figure 12:
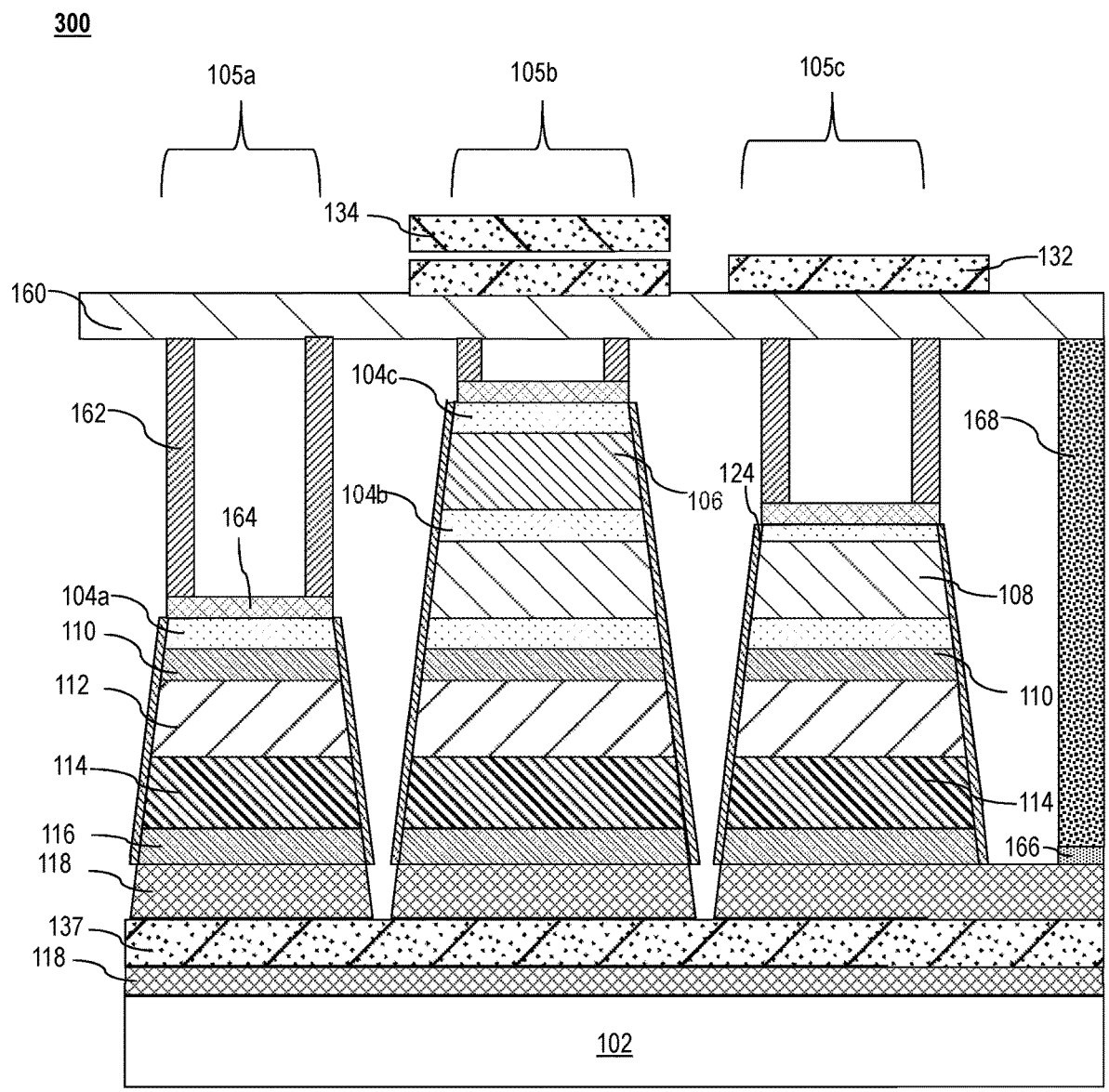
FIG. 12 illustrates a cross-sectional view of system according to one or more embodiments.

With reference to FIG. 12, in one or more embodiments, only one epitaxial reflector 137 is grown. In some embodiments, the epitaxial reflector 137 may be tuned for blue electroluminescence. In one or more embodiments, the epitaxial reflector 137 may be designed to have a vertical resistance low enough that it does not cause a significant voltage drop at typical ranges of LED operating current. In one or more embodiments, the metal contacts are designed to have high optical transmittance, which may be achieved by reducing the thickness of metal layers and/or the surface area covered by them. In one or more embodiments, the sheet conductance of n-type layers 104a, 104b, 104c is sufficient that metals are not required for current spreading through the active layers. In one or more embodiments, wavelength selective reflector coatings 132, 134 are applied to the second subpixel 105b and the third subpixel 105c. A glass substrate 160 which has been pre-patterned with an anode contact grid and transparent thin-film transistor driver circuitry is bonded to the wafer, forming a semi-transparent display 300. In one or more embodiments, a common cathode contact 168 is made to the n-type layer 118 exposed at the edge of the wafer, as shown in FIG. 12.

In addition to being applicable to a semi-transparent display, the embodiment illustrated in FIG. 12 has the advantage that blue photons are more efficiently converted into green and red ones due to the presence of selective blue reflectors on both sides of the device.

In one or more unillustrated embodiments, a device which contains LEDs of only two different colors (for example, leaving out the second photoluminescence quantum well 106 and the third n-type layer 104c of the epitaxial growth process illustrated in FIG. 1 and the extra post-growth processing associated with them) is formed. Although the embodiments describes above pertain to blue, red, and green colors, the disclosure is not limited to such colors. In one or more embodiments, any combination of colors or shades of the same color (for example, three groups of QWs with 430 nm, 450 nm, and 470 nm wavelength which are all perceived by the eye as blue). In one or more embodiments, the absorption probability of the electroluminescence of the first group of QWs is non-negligible in the second and third groups of QWs.

Figure 13:
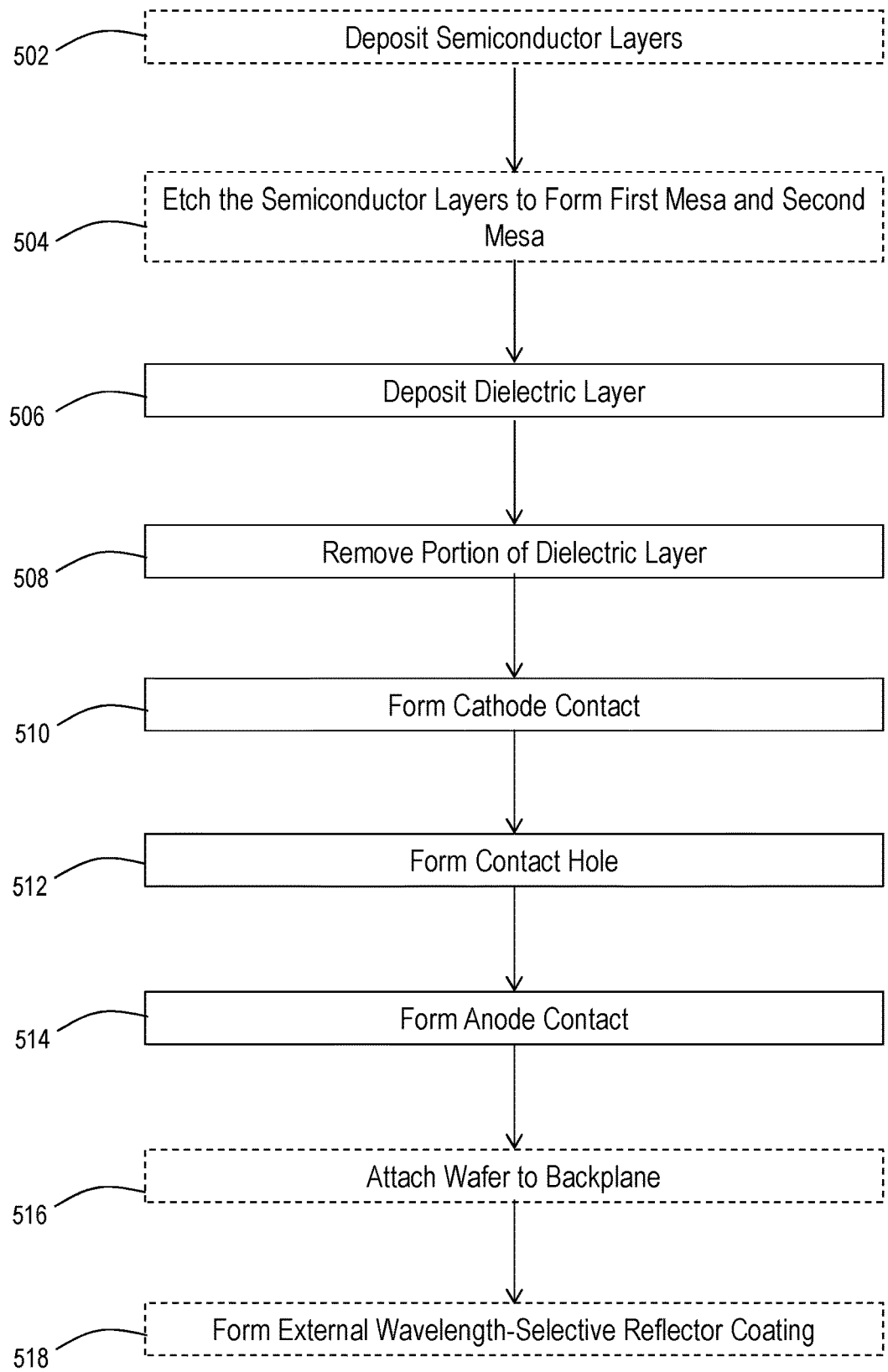
FIG. 13 illustrates a process flow diagram of a method according to one or more embodiments.

FIG. 13 illustrates a process flow diagram of a method 500 of manufacturing an LED device according to one or more embodiments. In one or more embodiments, a method of manufacturing a light emitting diode (LED) device begins at operation 502 where semiconductors layers are deposited or grown on a substrate. In one or more embodiments, the semiconductor layers comprises one or more of a substrate 102, a nucleation layer 122, a defect reduction layer 120, an n-type layer 118, a dilute indium concentration layer 116, electroluminescence quantum wells 114, electron blocking layer and p-type layer 112, a tunnel junction 110, a first n-type layer 104a, a first group of photoluminescence quantum wells 116, second n-type layer 104b, a second group of photoluminescence quantum wells 106, and a third n-type layer 104c. At operation 504, the semiconductor layers are etched to form at least a first subpixel 105a, a second subpixel 105b, and a third subpixel 105c. The first subpixel 105a and second subpixel 105b are separated by a trench 107a, and the second subpixel 105b and third subpixel 105c are separated by a trench 107b. At operation 506, a dielectric layer 124 is deposited on the semiconductor surface. In one or more embodiments, at operation 508, a portion of the dielectric layer is removed in the trench 107a, 107b. At operation 510, a cathode contact is formed in the trench 107a, 107b. At operation 512, a contact hole 128 is formed.

At operation 514, an anode contact metal 130 is deposited in the contact hole 128.

In some embodiments, the method 500 at operation 516 further comprises attaching the wafer to a backplane and, at operation 518, formation of an external wavelength-selective reflector coating applied to the side of the device 100 opposite the anode contact 130.

Figure 14:
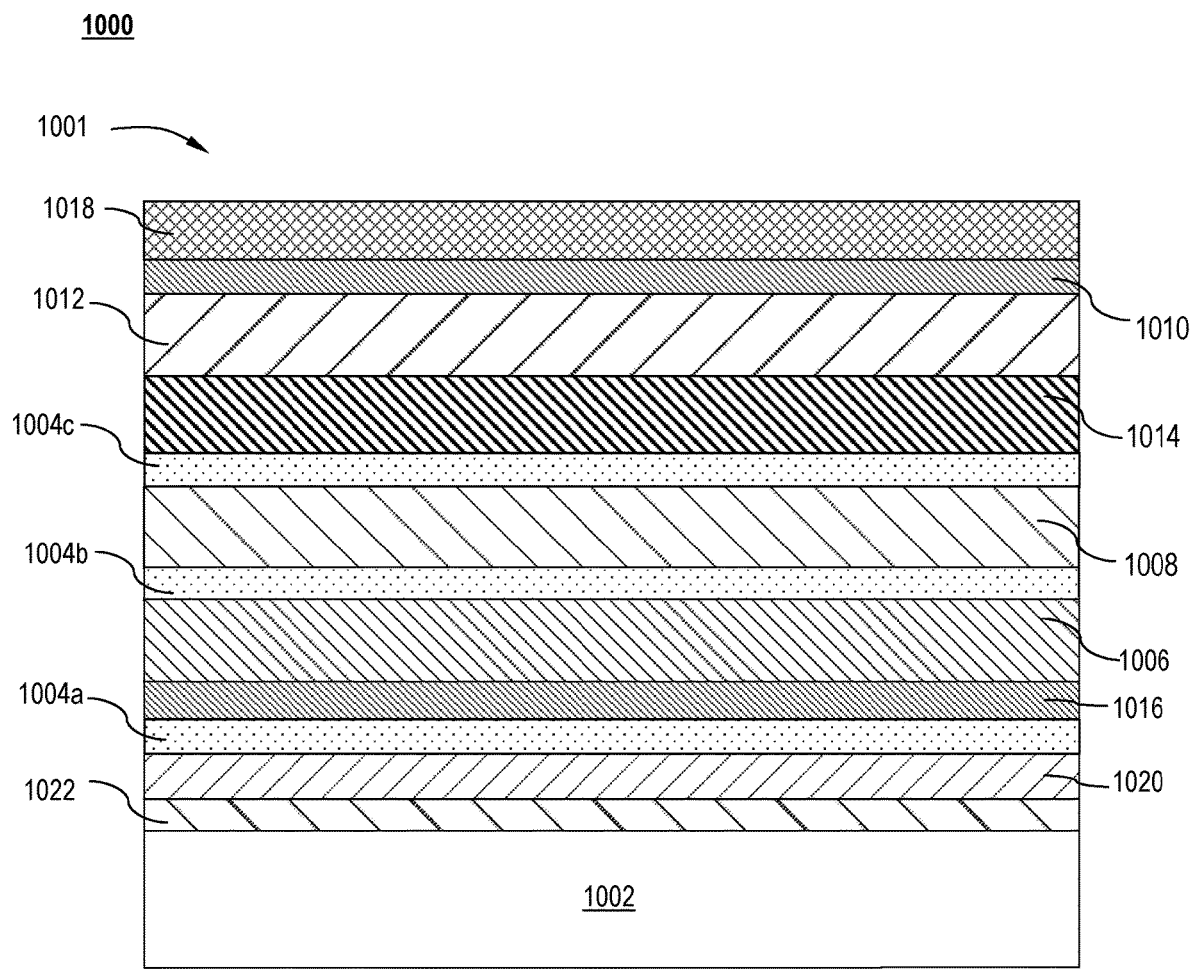
FIG. 14 illustrates a cross-sectional view of an LED device including multiple quantum wells according to one or more embodiments.

FIGS. 14 through 21 illustrate cross-sectional views of a device 1000 according to one or more embodiments. An aspect of the disclosure pertains to a method of manufacturing a LED array. Referring to FIG. 14, a LED device 1000 is manufactured containing two or more groups of quantum wells of different emission wavelengths in the same wafer. In one or more embodiments, a first group of quantum wells (with shortest emission wavelength) is located between a p-type layer and a first n-type layer which forms a p-n junction with the p-type layer. In one or more embodiments, a tunnel junction connects the p-layer of the p-n junction with a second n-type layer at a different position in the epitaxy stack versus the first n-type layer. In one or more embodiments, second and third groups of quantum wells with longer emission wavelengths are located within the second n-type layer placed between them and the p-n junction. In one or more embodiments, a tunnel junction connects the p-layer of the p-n junction with the second n-type layer.

In one or more embodiments, the first part of the epitaxy involves the growth of a nucleation layer 1022, a defect reduction layer 1020, and an n-type layer 1004a and may be the same as in a conventional LED growth run using a sapphire or other applicable growth substrate 1002.

The substrate 1002 may be any substrate known to one of skill in the art which is configured for use in the formation of LED devices. In one or more embodiments, the substrate 1002 comprises one or more of sapphire, silicon carbide, silica (Si), quartz, magnesium oxide (MgO), zinc oxide (ZnO), spinel, and the like. In one or more embodiments, the substrate 1002 is a transparent substrate. In specific embodiments, the substrate 102 comprises sapphire. In one or more embodiments, the substrate 1002 is not patterned prior to formation of the LEDs. Thus, in some embodiments, the substrate is 1002 not patterned and can be considered to be flat or substantially flat. In other embodiments, the substrate 1002 is a patterned substrate.

In one or more embodiments, the n-type layer 1004*a* may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type layer 1004*a* comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type layer 1004*a* comprises gallium nitride (GaN). In one or more embodiments, the n-type layer 1004*a* is doped with n-type dopants, such as silicon (Si) or germanium (Ge). The n-type layer 1004*a* may have a dopant concentration significant enough to carry an electric current laterally through the layer.

In one or more embodiments, the layers of III-nitride material which form the first LED, the second LED and the third LED are deposited by one or more of sputter deposition, atomic layer deposition (ALD), metalorganic chemical vapor deposition (MOCVD), physical vapor deposition (PVD), plasma enhanced atomic layer deposition (PEALD), and plasma enhanced chemical vapor deposition (PECVD).

In one or more embodiments, a LED device 1000 is manufactured by placing the substrate 1002 in a metalorganic vapor-phase epitaxy (MOVPE) reactor so that the LED device layers are grown epitaxially.

In one or more embodiments, a nucleation layer 1022 is formed on the substrate 1002 prior to the defect reduction layer 1020. In one or more embodiments, the nucleation layer comprises a III-nitride material. In specific embodiments, the nucleation layer 1022 comprises gallium nitride (GaN) or aluminum nitride (AlN).

In one or more embodiments, a first group of photoluminescence quantum wells 1006 is grown on a top surface of the n-type layer 1004*a*. In one or more embodiments, the photoluminescence quantum wells 1006 emit light having a wavelength in a range of from about 600 nm to about 750 nm. In one or more embodiments, the design of the photoluminescence quantum wells 1006 may differ from the active region of a conventional (red) LED in that the n-type doping concentration and the number of wells may be different, among other possible differences.

In one or more embodiments, a second n-type layer 1004*b* may be grown over the photoluminescence quantum wells 1006. The second n-type layer 1004*b* has the same doping requirements as first n-type layer 1004*a*, but the first n-type layer 1004*a* and the second n-type layer 1004*b* may have different thicknesses.

After formation of the n-type layer 1004*b*, a group of photoluminescence quantum wells 1008 is grown. In one or more embodiments, the photoluminescence quantum wells 1008 emit light having a wavelength in a range of from about 460 nm to about 570 nm. In one or more embodiments, the design of the photoluminescence quantum wells 1008 may differ from the active region of a conventional green LED in that the n-type doping concentration and the number of wells may be different, among other possible differences. In one or more embodiments, the doping concentration in the photoluminescence quantum wells 1008 is set high enough to avoid a significant voltage drop when this layer is part of the LED circuit. Subsequently, a third n-type layer 1004*c* is grown on the photoluminescence quantum wells 1008. The third n-type layer 1004*c* has the same doping requirements as first n-type layer 1004*a* and the second n-type layer 10004*b*, but the first n-type layer 1004*a*, the second n-type layer 1004*b*, and the third n-type layer 1004*c* may have different thicknesses.

It should be noted that the positions of photoluminescence quantum wells 1008 and the photoluminescence quantum wells 1006 within the epitaxy stack 1001 could be interchanged in one or more embodiments. Depending on the internal quantum efficiency (IQE) values and absorption coefficients of the photoluminescence quantum wells 1006 and photoluminescence quantum wells 1008, an arrangement with the positions of QWs interchanged versus that depicted in FIG. 14 may be favorable for some applications.

In one or more embodiments, a plurality of electroluminescence emitting quantum wells 1014 is grown on the third n-type layer 1004*c*. In one or more embodiments, the electroluminescence emitting quantum wells 1014 may be doped with n-type doping.

The electroluminescence emitting quantum wells 1014 may be formed using any deposition technique known to one of skill in the art. The electroluminescence emitting quantum wells 1014 may comprise a sequence of multiple quantum wells emitting the same wavelength of light. In one or more embodiments, the electroluminescence emitting quantum wells 1014 emit light having a wavelength in a range of from about 410 nm to about 495 nm. The electroluminescence emitting quantum wells 1014 may comprise different layers of indium gallium nitride (InGaN) and gallium nitride (GaN). The emission color may be controlled by the relative mole fractions of indium (In) and gallium (Ga) in the InGaN layer and/or by the thicknesses of the multiple quantum wells.

In one or more embodiments, an individual quantum well within the electroluminescence emitting quantum wells 1014 may have an InGaN thickness in a range of from about 0.5 nm to about 10 nm and a GaN barrier thickness in a range of from about 2 nm to about 100 nm. The total number of quantum wells in the electroluminescence emitting quantum wells 1014 may be in a range of from 1 to 25.

In one or more embodiments, after the growth of the electroluminescence emitting quantum wells 1014, electron blocking layers and p-type layers 1012 are grown using deposition techniques known to one of skill in the art. In one or more embodiments, the p-type layers 1012 comprise gallium nitride (GaN).

After completing the p-type layer 1012 of the LED, the growth conditions are then changed to grow a tunnel junction 1010. In one or more embodiments, the tunnel junction 1010 may be similar to, but is not limited to, tunnel junctions known to one of skill in the art. After the growth of the tunnel junction 1010, an n-type layer 1018 is grown on the tunnel junction 1010. The n-type layer 1018 may be thin, or it could be much thicker with thickness in the tens or hundreds of nanometers. In one or more embodiments, the n-type layer 1018 is a current spreading layer.

In one or more embodiments, the n-type layer 1018 may comprise any Group III-V semiconductors, including binary, ternary, and quaternary alloys of gallium (Ga), aluminum (Al), indium (In), and nitrogen (N), also referred to as III-nitride materials. Thus, in some embodiments, the n-type layer 1018 comprises one or more of gallium nitride (GaN), aluminum nitride (AlN), indium nitride (InN), gallium aluminum nitride (GaAlN), gallium indium nitride (GaInN), aluminum gallium nitride (AlGaN), aluminum indium nitride (AlInN), indium gallium nitride (InGaN), indium aluminum nitride (InAlN), and the like. In a specific embodiment, the n-type layer 1018 comprises gallium nitride (GaN). In one or more embodiments, the n-type layer 1018 is doped with n-type dopants, such as silicon (Si) or germanium (Ge). The n-type layer 1018 may have a dopant concentration significant enough to carry an electric current laterally through the layer.

In one or more embodiments, the doping concentration of the n-type layer 1018 may be high enough to facilitate formation of ohmic contacts with common metals such as Al, but the doping concentration of the n-type layer 1018 need not be as high as that of the tunnel junction 1010. In one or more embodiments, the n-type layer 1018 could have a graded doping concentration or it could be divided into several sections with different doping concentrations.

Figure 15A:
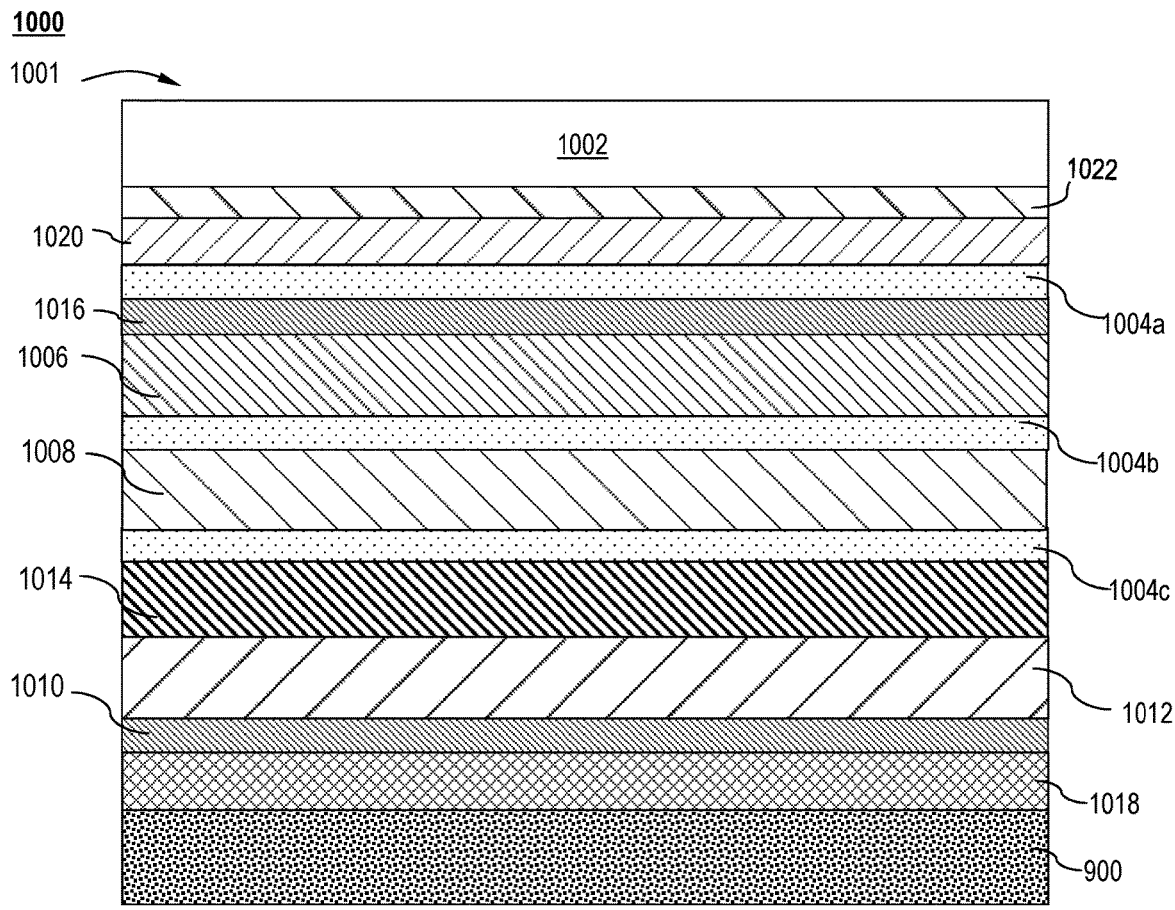
FIG. 15A illustrates a cross-sectional view of an LED device including multiple quantum wells according to one or more embodiments.

Referring to FIG. 15A, the epitaxy stack 1001 is bonded to a handle wafer 900. The handle wafer 900 forms a temporary bond to the n-type layer 1018. In one or more embodiments, the handle wafer may be comprised of any material that can be processed into wafers of adequately low roughness and warp for bonding, which remains mechanically rigid during the bonding process. It some embodiments, it can be advantageous to use a handle wafer made from the same material as the growth substrate, or one that is not too different in thermal and mechanical properties from the growth substrate. In one or more embodiments, the bonding process typically involves coating one or more layers on the handle wafer and the back of the growth substrate prior to bonding. Various processes are possible and may utilize metal eutectics, polymers, or oxide-oxide bonds.

Figure 15B:
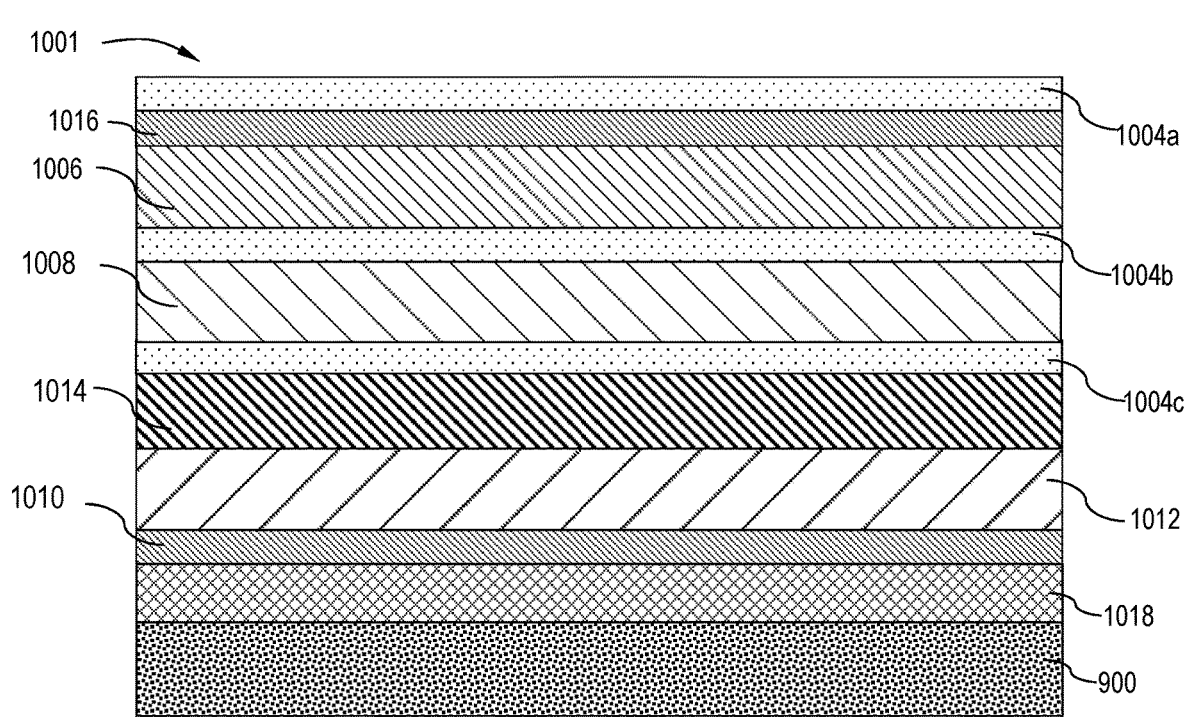
FIG. 15B illustrates a cross-sectional view of an LED device including multiple quantum wells according to one or more embodiments.

With reference to FIG. 15B, the substrate 1002 is removed. In some embodiments, the substrate 1002 may be removed by any technique known to the skilled artisan, including, but not limited to laser lift-off, selective chemical etching, and the like. In one or more embodiments, the nucleation layer 1022 and the defect reduction layer 1020 are removed. The nucleation layer 1022 and the defect reduction layer 1020 may be removed by any suitable technique known to the skill artisan including, but not limited to, dry etching.

Figure 16:
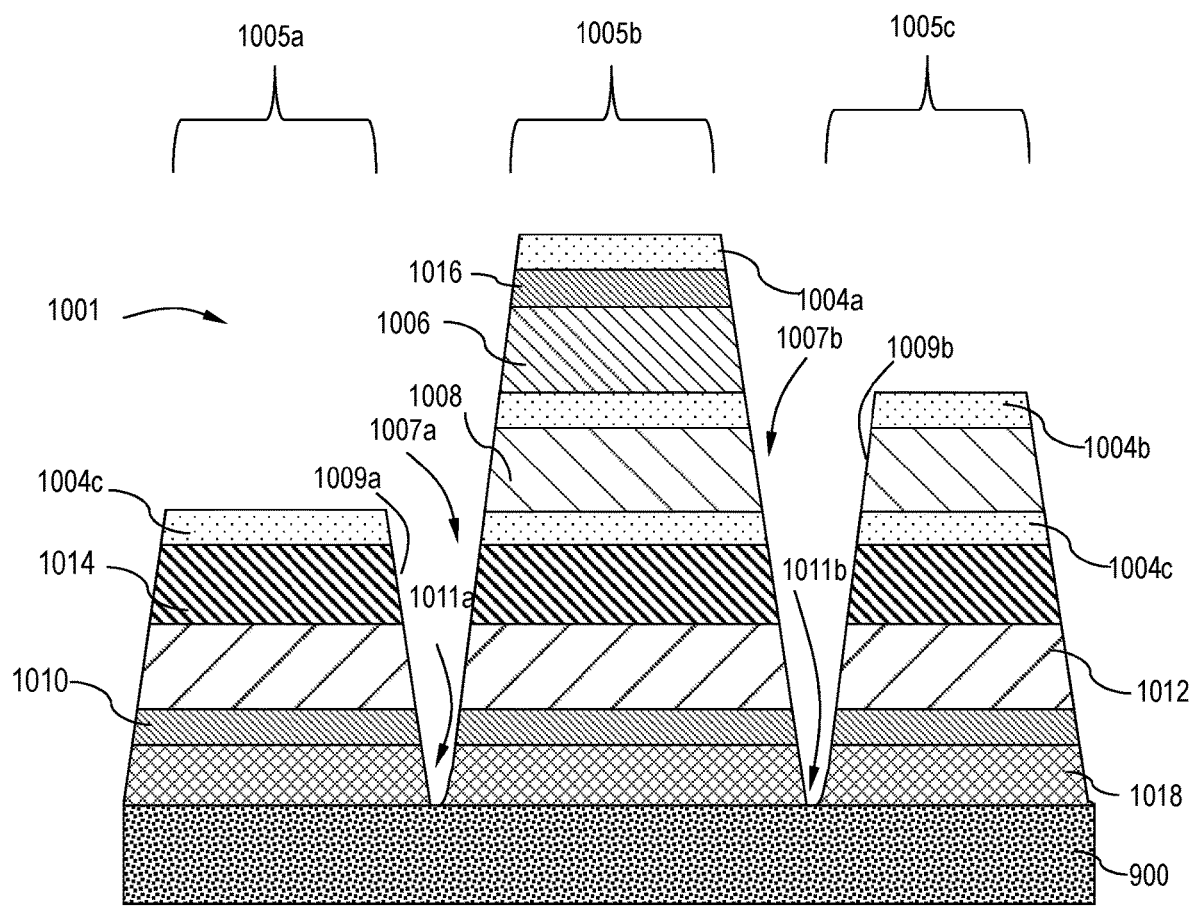
FIG. 16 illustrates a cross-sectional view of an LED device including multiple quantum wells according to one or more embodiments.

Referring to FIG. 16, a plurality of subpixels is formed by etching a first subpixel 1005a, a second subpixel 1005b, and a third subpixel 1005c into the wafer 1001. In one or more embodiments, the first subpixel 1005a and the second subpixel 1005b are separated by a trench 1007a. In some embodiments, the trench 1007a may be formed using a conventional directional etching process, such as dry etching. The trench 1007a may be any suitable depth and may extend from the top surface of the first n-type layer 1004a through the n-type layer 1018 to the handle wafer 900. The trench 1007a may comprise at least one sidewall 1009a and a bottom surface 1011a. In one or more embodiments, the second subpixel 1005b and the third subpixel 1005c are separated by a trench 1007b. In some embodiments, the trench 1007b may be formed using a conventional directional etching process, such as dry etching. The trench 1007b may be any suitable depth and may extend from the top surface of the first n-type layer 1004a through the n-type layer 1018 to the handle wafer 900. The trench 1007b may comprise at least one sidewall 1009b and a bottom surface 1011b.

In one or more embodiments, the first subpixel 1005a may have a height (thickness) that is less than the height (thickness) of the second subpixel 1005b and less than the height (thickness) of the third subpixel 1005c. In one or more embodiments, the third subpixel 1005c may have a height (thickness) that is less than the height (thickness) of the second subpixel 1005b.

In one or more embodiments, the etched surface (trench 1007a, 1007b) may have an angle of inclination up to 45 degrees. In some embodiments, the etched surface (trench 1007a, 1007b) may be substantially completely vertical.

In one or more embodiments, the formation of the plurality of subpixels 1005a, 1005b, 1005c involves an additional etching step compared to conventional LED manufacturing methods. In one or more embodiments, the additional etching step removes the first group of photoluminescent quantum wells 1008 and the second group of photoluminescent quantum wells 1006 at a first set of positions 1005a on the handle wafer 900, removes the second group of photoluminescent quantum wells 1006 at a second set of positions 1005c on the handle wafer 900, and leaves unetched a third set of positions 1005b on the handle wafer. The thickness of material that needs to be etched from the first set of positions 1005a is thicker than that to be removed from the second set of positions 1005c. The thickness difference may be accommodated either by separating the additional etch process into two separate etch steps, or by coating a sacrificial layer onto the second set of positions 1005c to reduce the depth of material etched at those positions in a single etch step. Dry etching using process conditions which favor a high vertical/lateral etch rate may be used for the additional etching step. This additional etching step may be one of the first steps in the process, or it may come later in the process (for example, after the mesa etch to expose the n-layer under the p-n junction).

In one or more embodiments, the first subpixel 1005a is a mesa comprising electroluminescence emitting quantum wells 1014. More specifically, the first subpixel 1005a comprises a first mesa including a third n-type layer 1004c on electroluminescence emitting quantum wells 1014 on a tunnel junction 1010 on electron blocking layers and p-type layers 1012. The p-type layers 112 may be on an n-type layer 118 on the handle wafer 900.

In one or more embodiments, the second subpixel 1005b is a mesa comprising a first group of photoluminescent quantum wells 1008 and a second group of photoluminescent quantum wells 1006 on an electroluminescent quantum well 1014. More specifically, the second subpixel 1005b comprises a second mesa including a first n-type layer 1004a on the second group of photoluminescent quantum wells 1006, a second n-type layer 1004b on the first group of photoluminescent quantum wells 1008, a third n-type layer 1004b on a group of electroluminescence emitting quantum wells 1014. The group of electroluminescence emitting quantum wells 1014 may be on electron blocking layers and p-type layers 112 on a tunnel junction 1010 on an n-type layer 118 on the handle wafer 900.

In one or more embodiments, the third subpixel 1005c is a mesa comprising a first group of photoluminescent quantum wells 1008 on an electroluminescent quantum well 1014. More specifically, the third subpixel 1005c comprises a third mesa including a second n-type layer 1004b on the first group of photoluminescent quantum wells 1008, a third n-type layer 1004c on a group of electroluminescence emitting quantum wells 1014. The group of electroluminescence emitting quantum wells 1014 may be on electron blocking layers and p-type layers 112 on a tunnel junction 1010 on an n-type layer 118 on the handle wafer 900.

In one or more embodiments, a p-type layer activation annealing step may be performed after the plurality of subpixels are etched because it is difficult for hydrogen to pass through n-type layers 1004a, 1004b, 1005c and annealing after the mesa etch allows hydrogen to escape laterally from the etched sidewalls.

Figure 17:
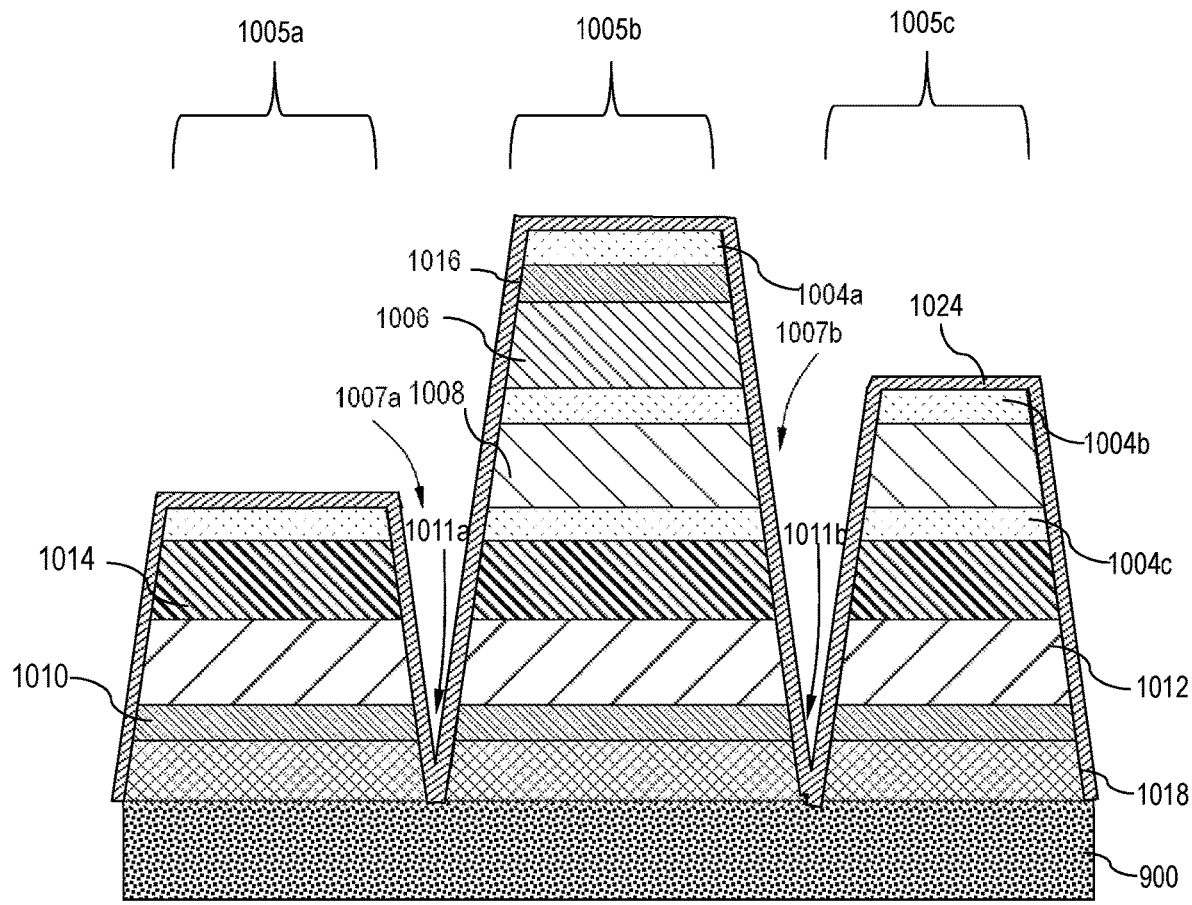
FIG. 17 illustrates a cross-sectional view of an LED device including multiple quantum wells according to one or more embodiments.

FIG. 17 shows formation of a dielectric layer 1024 on the pluralities of subpixels 1005a, 1005b, 1005c and in the trench 1007a, 1007b. The dielectric layer 1024 may be formed using a conventional deposition technique, such as, for example, CVD, PECVD, ALD, evaporation, sputtering, chemical solution deposition, spin-on deposition, or other like processes.

In one or more embodiments, the dielectric layer 1024 may comprise any suitable dielectric material known to the skilled artisan. In some embodiments, the dielectric material comprises one of more of silicon nitride (SiN), titanium oxide ($TiO_x$), niobium oxide ($NbO_x$), aluminum oxide ($AlO_x$), hafnium oxide ($HfO_x$), tantalum oxide ($TaO_x$), aluminum nitride (AlN), silicon oxide ($SiO_x$), and hafnium-doped silicon dioxide ($HfSiO_x$). In one or more embodiments, the dielectric layer 1024 has a thickness greater than about 100 nm, or greater than about 500 nm, or greater than about 1000 nm.

In one or more embodiments, the dielectric layer 1024 is substantially conformal. As used herein, a layer which is "substantially conformal" refers to a layer where the thickness is about the same throughout (e.g., on the top surface of each subpixel, on the at least one sidewall 1009a, 1009b, and on the bottom surface 1011a, 1011b of the trench 1007a, 1007b). A layer which is substantially conformal varies in thickness by less than or equal to about 5%, 2%, 1% or 0.5%.

Figure 18:
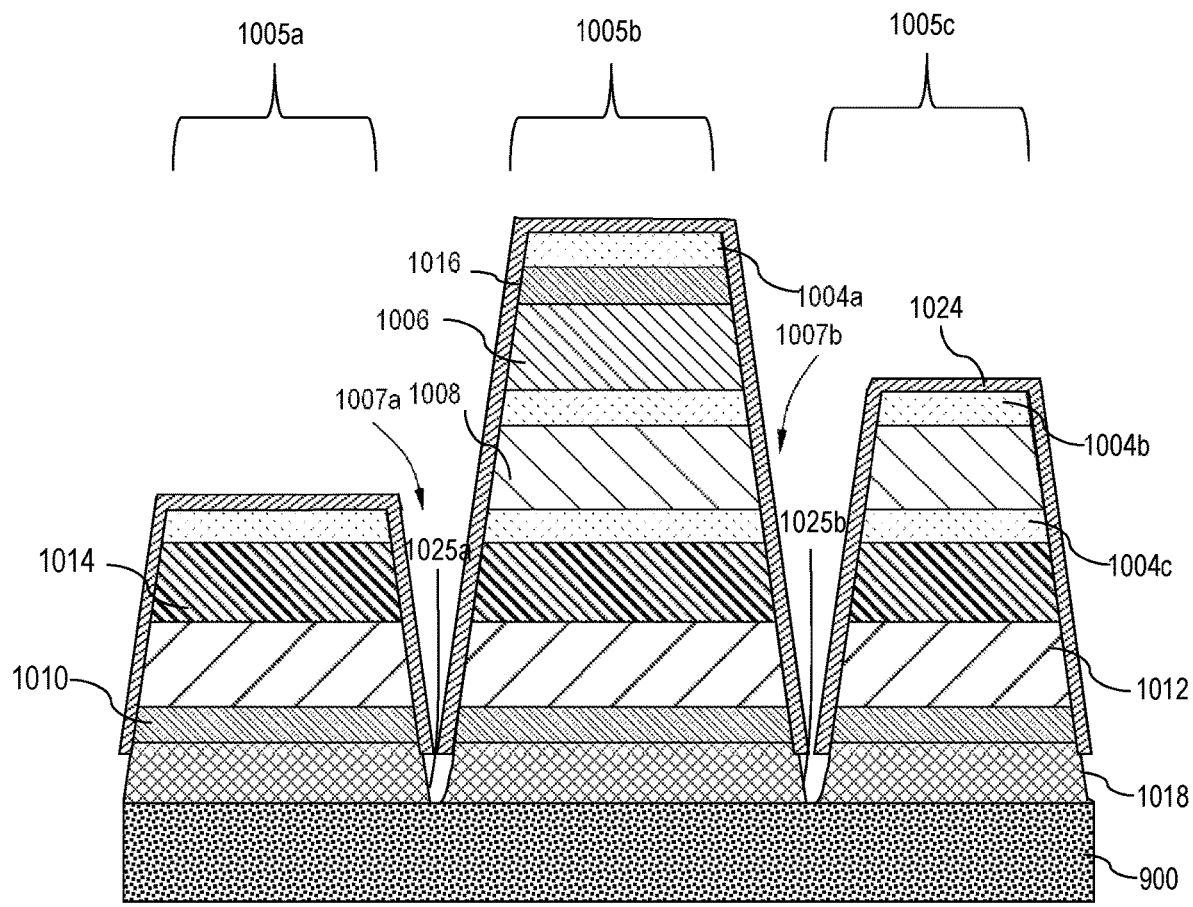
FIG. 18 illustrates a cross-sectional view of an LED device including multiple quantum wells according to one or more embodiments.

In some embodiments, the dielectric layer 1024 forms on the bottom surface 1011a, 1011b of the trench 1007a, 1007b. In other embodiments, the dielectric layer 1024 is not on the bottom surface 1011a, 1011b of the trench 1007a, 1007b and the handle wafer 900 is exposed on the bottom surface of the trench 1007a, 1007b. Referring to FIG. 18, portions of the dielectric layer 1024 may be removed from the bottom surface 1011a, 1011b and at least one sidewall 1009a, 1009b of the trench 1007a, 1007b. The portions of the dielectric layer 1024 may be removed using a conventional directional etching process, such as dry etching. In one or more embodiments, when portions of the dielectric layer 1024 are removed from the bottom surface 1011a, 1011b and at least one sidewall 1009a, 1009b of the trench 1007a, 1007b, an exposed portion 1025a, 1025b is formed. The exposed portion 1025a, 1025b may include portions of the n-type layer 1018 and the handle wafer 900 may be exposed in the trench 1007a, 1007b.

Figure 19:
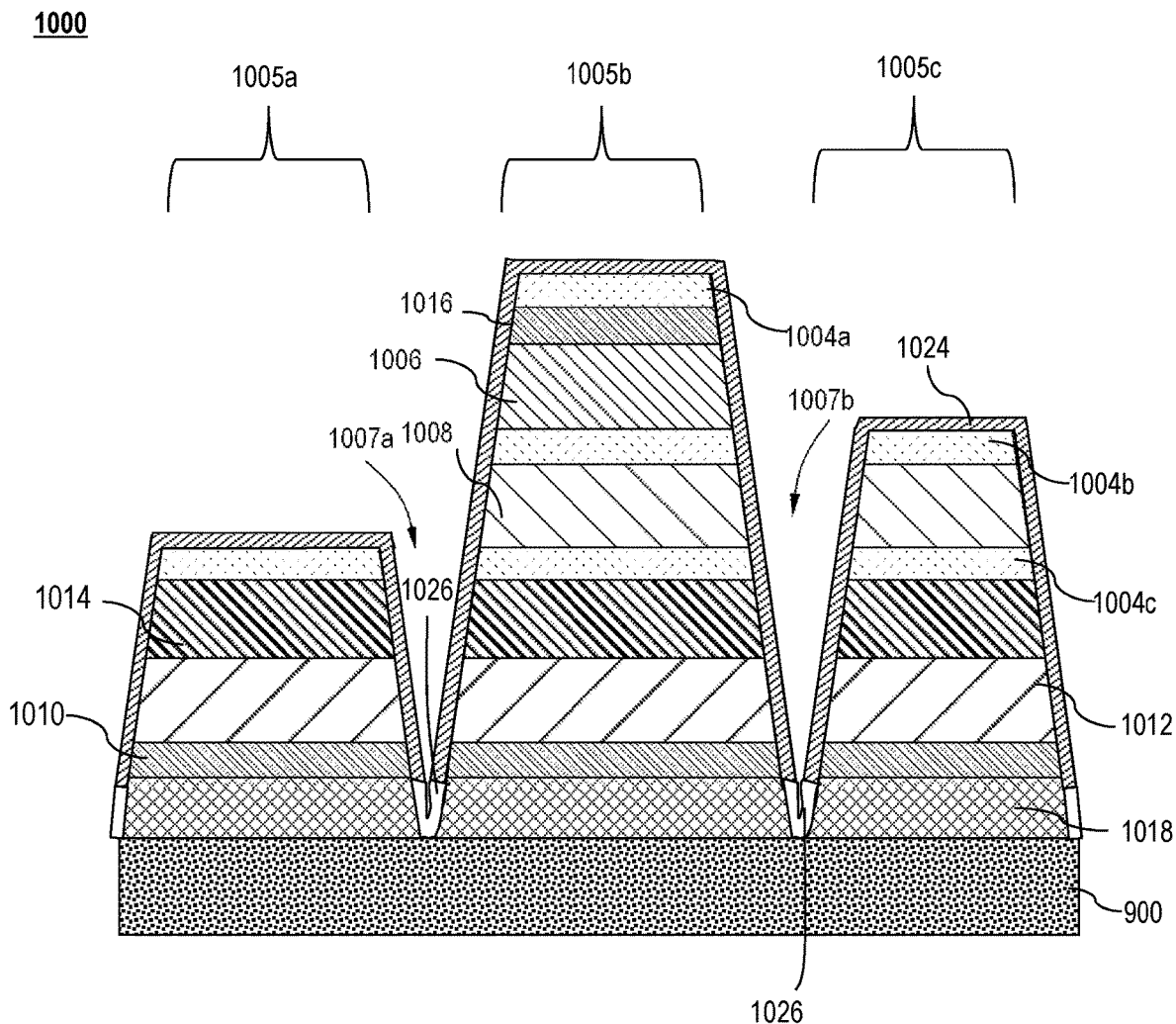
FIG. 19 illustrates a cross-sectional view of an LED device including multiple quantum wells according to one or more embodiments.

Referring to FIG. 19, in one or more embodiments, an anode contact metal 1026 is deposited on the exposed portion 1025 in the trench 1007a, 1007b. In one or more embodiments, the anode contact metal 1026 may comprise any suitable material known to the skilled artisan. In one or more embodiments, the anode contact metal 1026 comprises a metal selected from one or more of silver (Ag), aluminum (Al), gold (Au), platinum (Pt), and palladium (Pd). In specific embodiments, the anode contact metal 1026 comprises silver (Ag) or aluminum (Al). In some embodiments, additional metals may be added in small quantities to the anode contact metal as adhesion promoters. Such adhesion promoters, include, but are not limited to, one or more of nickel (Ni), titanium (Ti), and chromium (Cr).

Figure 20:
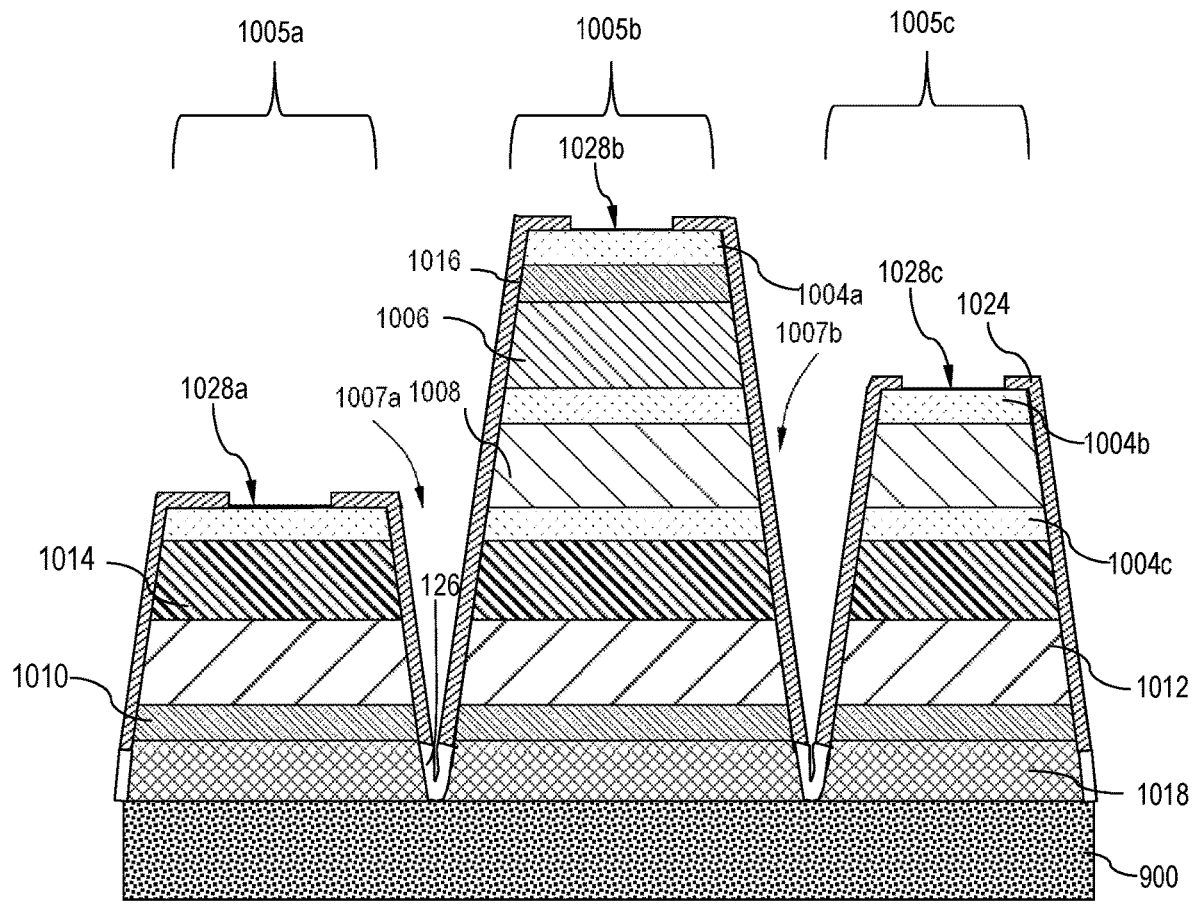
FIG. 20 illustrates a cross-sectional view of an LED device including multiple quantum wells according to one or more embodiments.

FIG. 20 shows formation of a contact hole 1028 in the dielectric layer 1024, exposing a top surface of the n-type layer 1004. In some embodiments a first contact hole 1028a is formed in the dielectric layer 1024 of the first subpixel 1005a, exposing a top surface of the third n-type layer 104c. A second contact hole 1028b may be formed in the dielectric layer 1024 of the second subpixel 1005b, exposing a top surface of the first n-type layer 1004a. A third contact hole 1028c may be formed in the dielectric layer 1024 of the third subpixel 1005c, exposing a top surface of the second n-type layer 1004b. The contact hole 1028a, 1028b, 1028c may be formed using a conventional directional etching process, such as dry etching.

Figure 21:
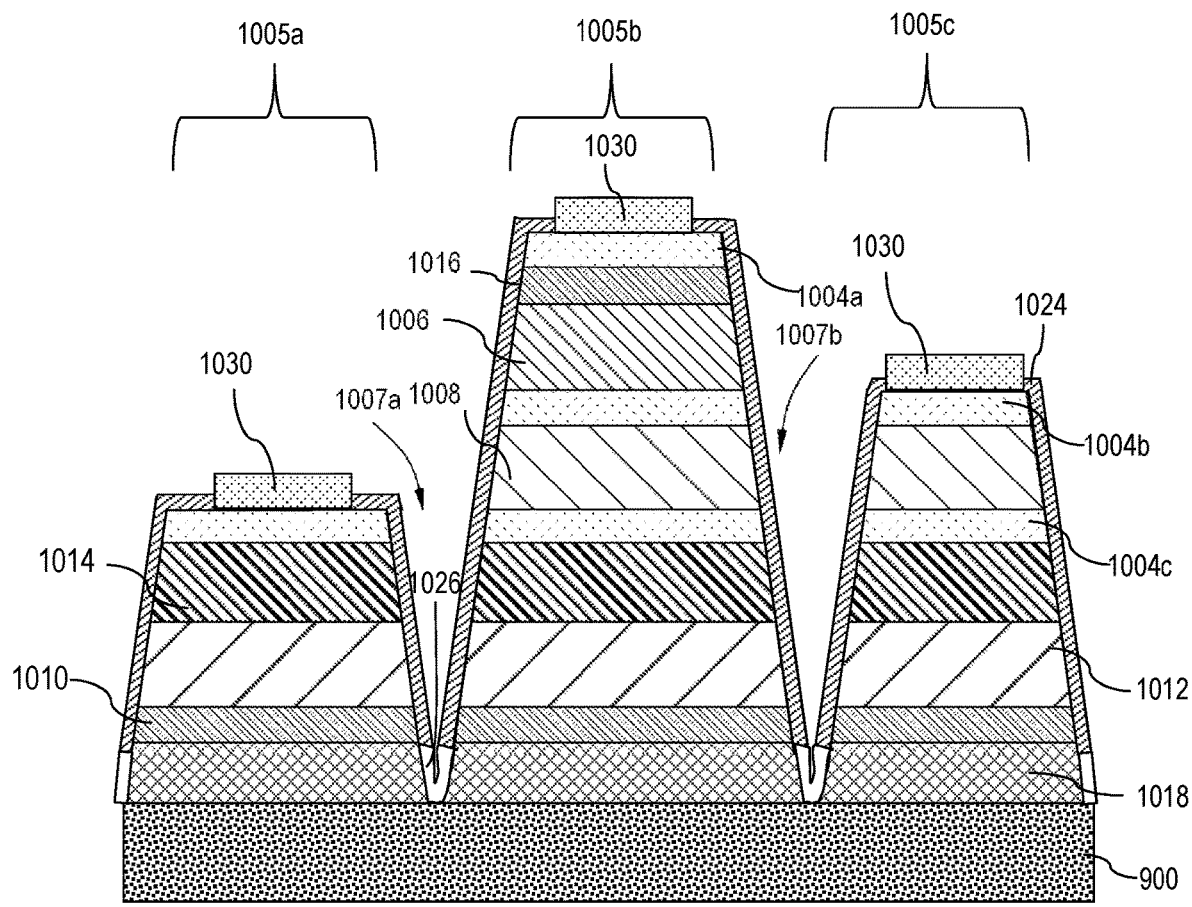
FIG. 21 illustrates a cross-sectional view of an LED device including multiple quantum wells according to one or more embodiments.

Referring to FIG. 21, a cathode contact metal 1030 is deposited in the contact hole 1028. In one or more embodiments, the cathode contact metal 1030 may comprise any suitable material known to the skilled artisan. In one or more embodiments, the cathode contact metal 1030 comprises an n-contact material selected from one or more of aluminum (Al), titanium (Ti) and chromium (Cr).

In one or more embodiments, the cathode contact 1030 and the anode contact 1026 may be made with the same metal in the same deposition and lift-off steps.

The dielectric passivation layer 1024 is shown as a single layer in the Figures, but it could alternatively be implemented as a multilayer coating of high and low refractive index materials with thicknesses optimized for maximum reflectivity in blue wavelengths. If implemented as a single layer, the optical thickness of the dielectric passivation layer 1024 may be co-optimized with the cathode metal 1030 to maximize reflectivity at blue wavelengths. The cathode contact 1030 may be made to the n-type layer on the sides of the mesas 1005a, 1005b, 1005c, making possible the use of a single mesa etch step to isolate the LEDs from each other and expose the cathode contact for metallization.

Figure 22:
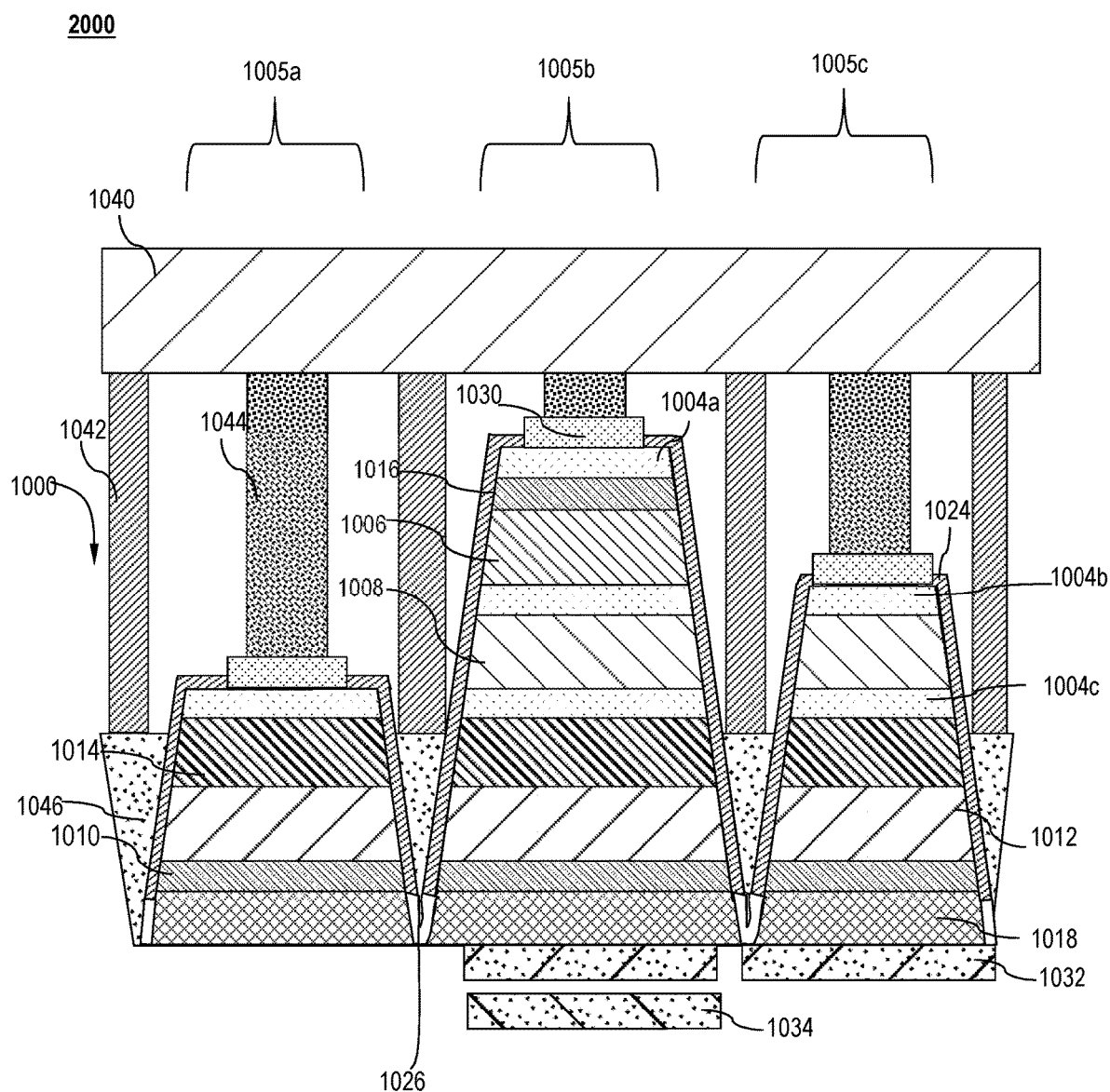
FIG. 22 illustrates a cross-sectional view of an LED device including multiple quantum wells according to one or more embodiments.

Referring to FIG. 22, in later stages of processing, the spaces between the mesas 1005a, 1005b, 1005c are filled with an electrically conductive material 1046, which could be, for example, electroplated copper (Cu). The entire wafer 1000 or a piece of the wafer 1000, which could be as small as an individual pixel containing three microLED sub-pixels, are bonded to a system substrate 1040 such as a display backplane to form a system 2000. An array of landing pads 1042, 1044 is arranged on the system substrate 1040 with dimensions aligned to those of the bonding pads on the LED wafer 1000. The landing pads 1042, 1044 may be connecting to display driver circuitry in the system substrate 1040. The landing pads 1042, 1044 may include sub-pixels of different heights to accommodate the differences in heights of the LEDs on the wafer, as shown in FIG. 22. Alternatively, the landing pads 1042, 1044 may be made from a material that is soft enough to accommodate the height differences by mechanical deformation in the bonding process. In one or more embodiments, the bonding mechanism may be based on application of pressure, localized heating, or a combination of the two.

Referring to FIG. 22, in one or more embodiments, after bonding, the handle wafer 900 is removed using any suitable technique known to the skilled artisan, such as by selective chemical etching. In one or more embodiments, wavelength selective reflector coatings 1032, 1034 are applied to the exposed surfaces of the sub-pixels 1005b, 1005c to prevent color contamination of those pixels with shorter wavelength light that is not completely absorbed in the QWs of longer wavelength. In some embodiments, the wavelength selective reflector coatings 1032, 1034 may comprise dichroic mirrors.

In one or more specific embodiments, the wavelength selective reflector coating 1032 for the third sub-pixel 1005c may be a distributed Bragg reflector (DBR) consisting of a repeated stack of dielectric materials with high and low refractive indices and thicknesses optimized to maximize reflectivity at the blue electroluminescence peak wavelength. In one or more embodiments, the second sub-pixel 1005b may use two connected distributed Bragg reflectors (DBR) optimized for high reflectivity at blue and green wavelengths, respectively, as wavelength selective reflector coatings 1032, 1034. In one or more embodiments, the wavelength selective reflector coatings 1032, 1034 may be patterned by lithographic methods.

Figure 23:
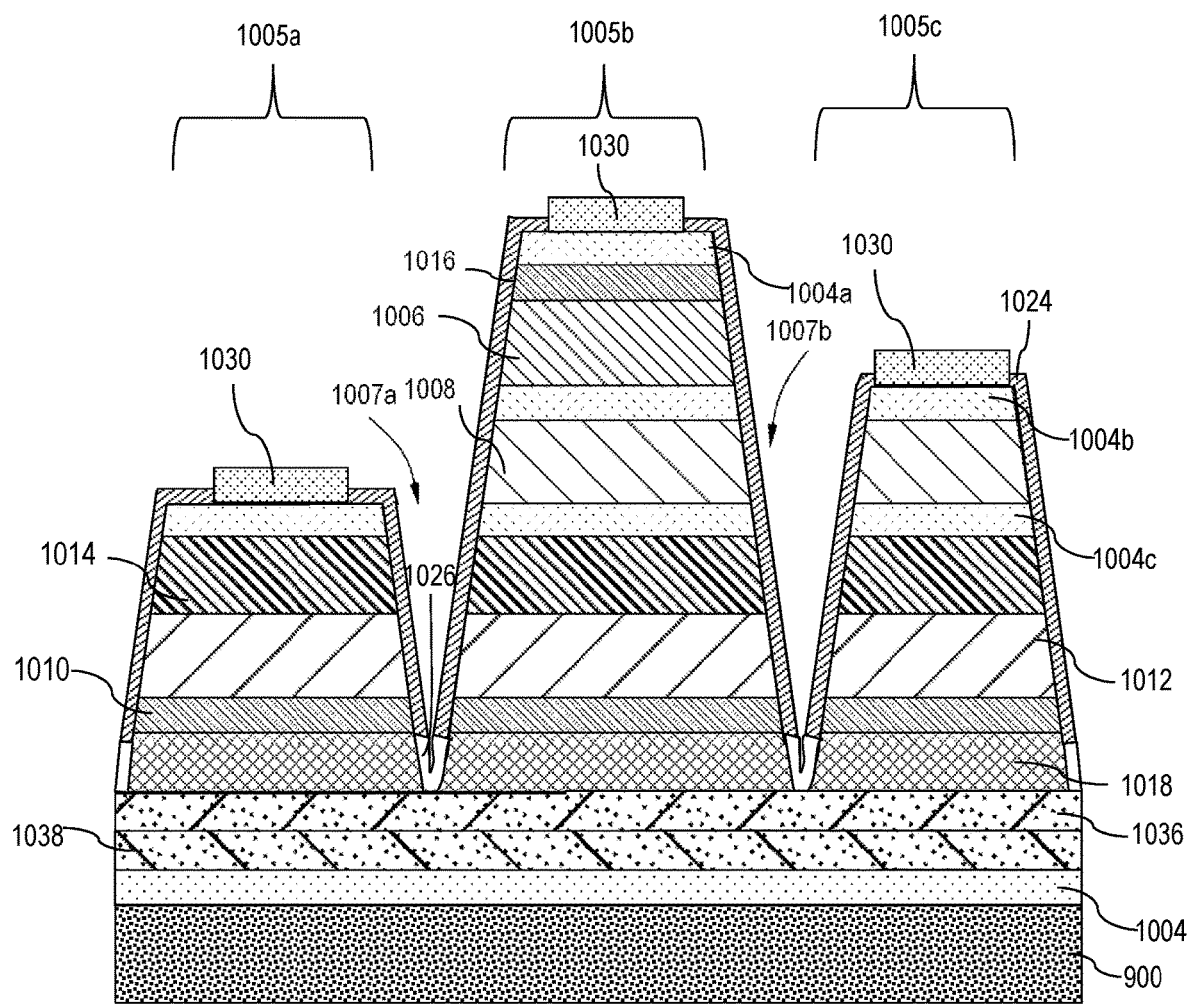
FIG. 23 illustrates a cross-sectional view of an LED device including multiple quantum wells according to one or more embodiments.
Figure 25:
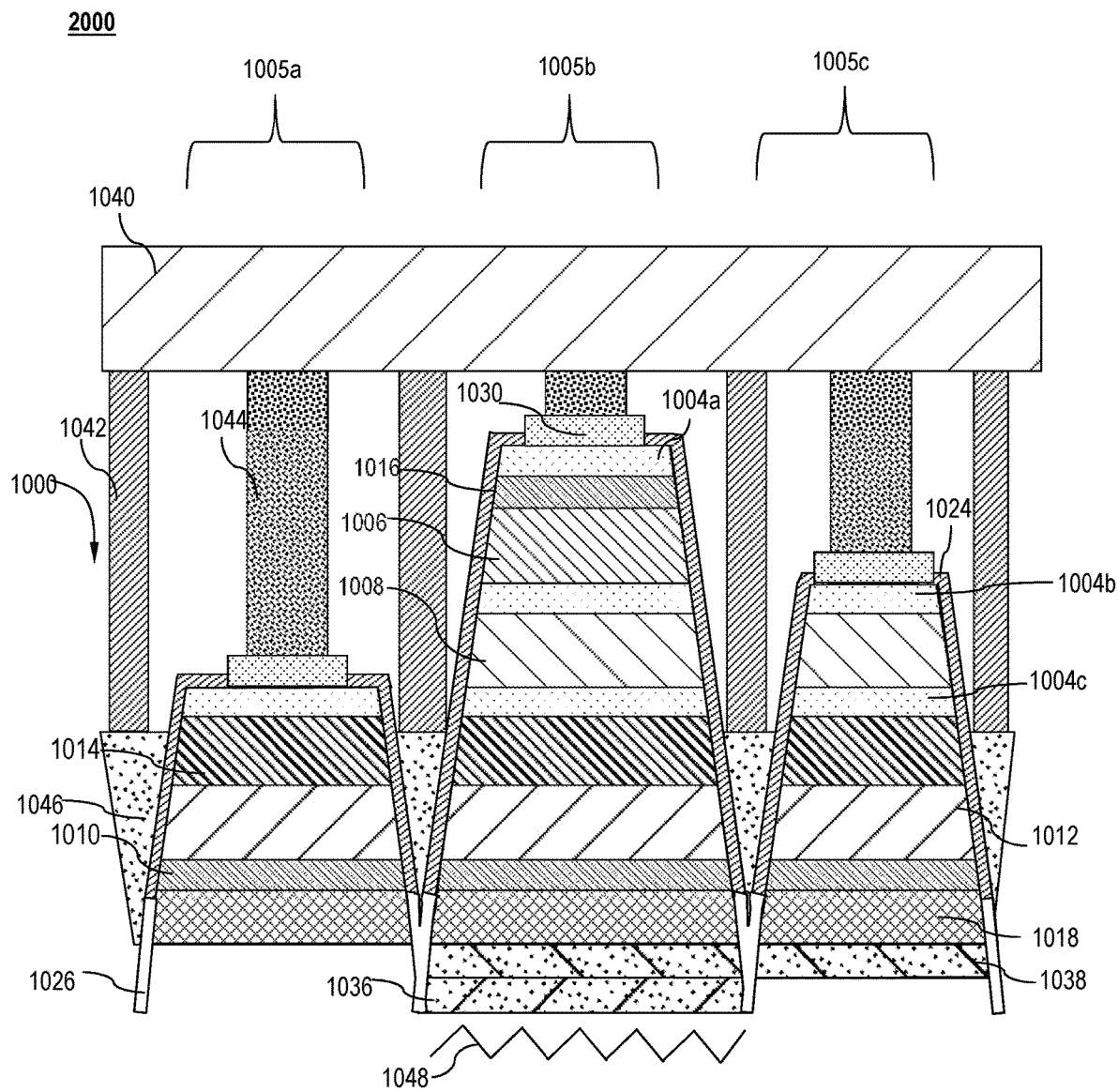
FIG. 25 illustrates a cross-sectional view of an LED device including multiple quantum wells according to one or more embodiments.

FIG. 23 illustrates an alternative embodiment. The epitaxial growth illustrated in FIG. 23 differs slightly from that of FIGS. 14 through 22. Referring to FIG. 23, in one or more embodiments, two epitaxial reflectors 1036, 1038 are grown. In some embodiments, at least one n-type layer 1004 is formed on the epitaxial reflectors 1036, 1038. In one or more embodiments, the epitaxial reflectors 1036, 1038 are dichroic mirrors. In specific embodiments, the epitaxial reflectors 1036, 1038 may be distributed Bragg reflectors (DBR) comprised of a sequence of alternating layers III-nitride materials with different refractive indices, such as, but not limited to, gallium nitride (GaN) and aluminum gallium nitride (AlGaN) or aluminum indium nitride (AlInN), or mixtures thereof. In one or more embodiments, implementations in which post-growth processing to oxidize or introduce porosity into one of the materials of the DBR to decrease its refractive index are also possible. In one or more embodiments, the period of the first epitaxial DBR 1036 is selected to maximum reflectivity at the green photoluminescence wavelength. The period of the second epitaxial DBR 1038 is selected to maximize reflectivity at the blue electroluminescence wavelength. In one or more embodiments, the epitaxial reflectors 1036, 1038 are advantageous in implementations that feature surface texturing, as depicted in FIG. 25. In embodiments that due not feature surface texturing, separated deposited mirrors that are not epitaxial are used.

Figure 24:
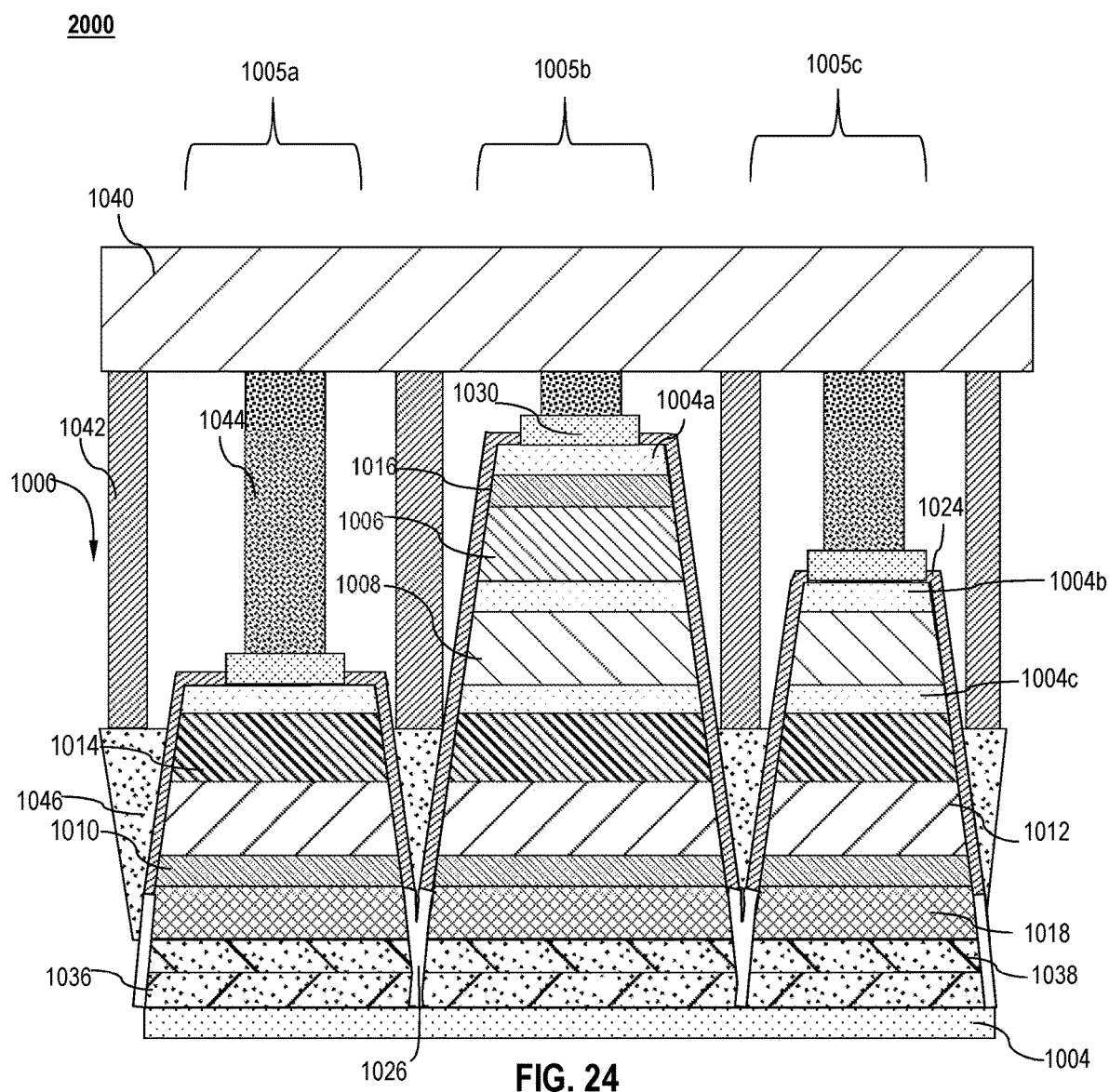
FIG. 24 illustrates a cross-sectional view of an LED device including multiple quantum wells according to one or more embodiments.

Referring to FIG. 24, bonding to a system substrate 1040 is carried out as described with respect to FIG. 22. With reference to FIG. 25, in one or more embodiments, the wafer 1000 may be subjected to an etching step after removal of the handle wafer 900, corresponding to the same stage of the process where deposition of wavelength selective reflective coatings 1032, 1032 was performed in FIG. 22. In one or more embodiments, both of the epitaxial DBRs 1036, 1038 are etched away for the first sub-pixel 1005a, only the first epitaxial DBR 1036 is etched away for the third sub-pixel 1005c, and no etching is done for the second sub-pixel 1005b. In other words the patterning of external reflector coatings as discussed with reference to FIG. 25 is replaced by position-selective etching of reflectors built into the epitaxy. In one or more embodiments, the embodiment represented in FIGS. 23 through 25 has the advantage that the exposed GaN surface 1004 may be textured using maskless photoelectrochemical or masked dry etching methods to increase light extraction efficiency. With reference to FIG. 25, only the second sub-pixel 1005b is textured 1048, but texturing could be extended to all three sub-pixels 1005a, 1005b, 1005c by including a sufficiently thick GaN layer in between the first and second epitaxial DBRs 1036, 1038 so that it can be textured after selective etch of the first DBR in the third sub-pixel 1005c, and by texturing the n-type layer 1018, which is exposed for the first sub-pixel 1005a.

Figure 26:
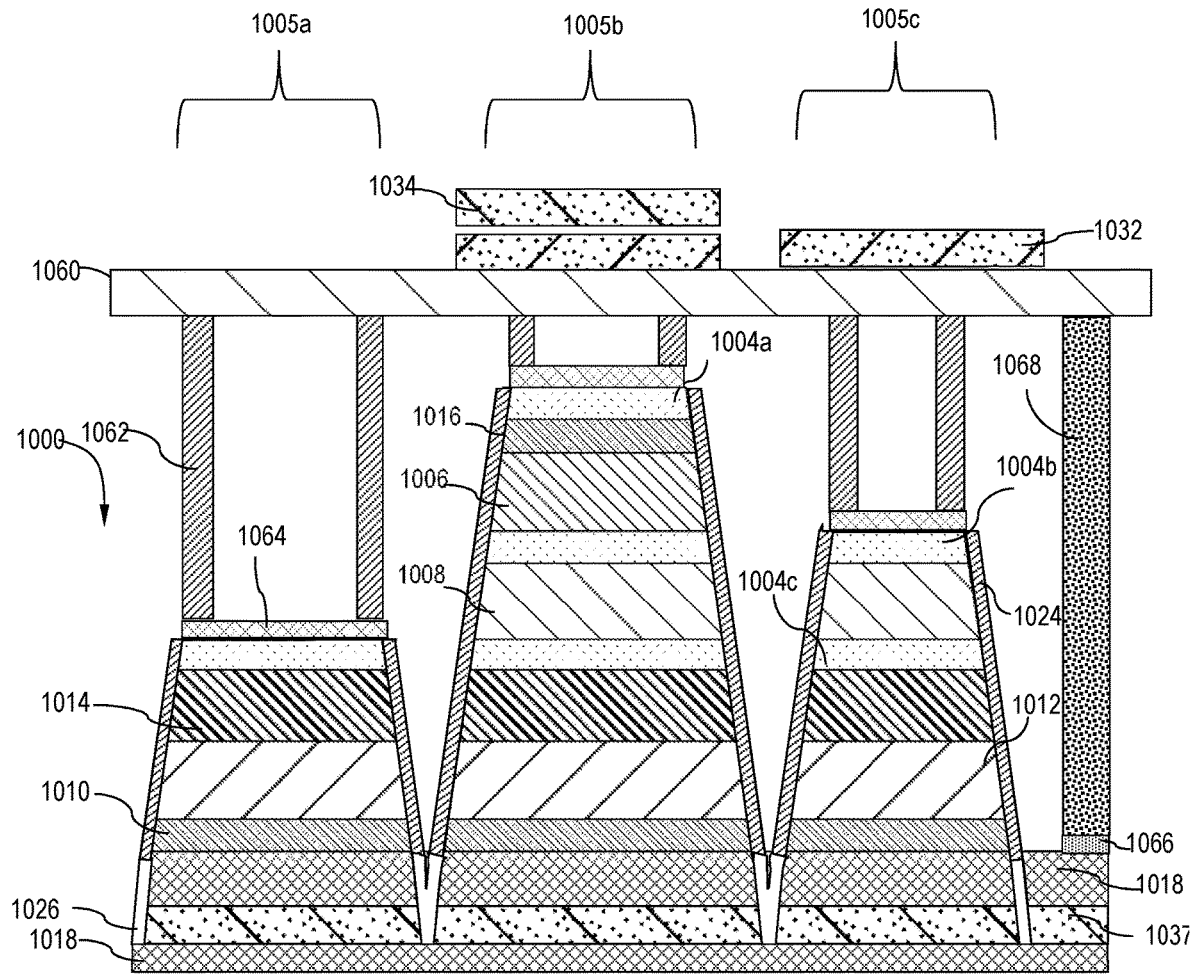
FIG. 26 illustrates a cross-sectional view of an LED device including multiple quantum wells according to one or more embodiments.

With reference to FIG. 26, in one or more embodiments, only one epitaxial reflector 1037 is grown. In some embodiments, the epitaxial reflector 1037 may be tuned for blue electroluminescence. In one or more embodiments, the epitaxial reflector 1037 may be designed to have a vertical resistance low enough that it does not cause a significant voltage drop at typical ranges of LED operating current. In one or more embodiments, the metal contacts are designed to have high optical transmittance, which may be achieved by reducing the thickness of metal layers and/or the surface area covered by them. In one or more embodiments, the sheet conductance of n-type layers 1004a, 1004b, 1004c is sufficient that metals are not required for current spreading through the active layers. In one or more embodiments, wavelength selective reflector coatings 1032, 1034 are applied to the second subpixel 1005b and the third subpixel 1005c. A glass substrate 1060 which has been pre-patterned with an anode contact grid and transparent thin-film transistor driver circuitry is bonded to the wafer, forming a semi-transparent display 3000. In one or more embodiments, a common cathode contact 1068 is made to the n-type layer 1018 exposed at the edge of the wafer, as shown in FIG. 26.

In addition to being applicable to a semi-transparent display, the embodiment illustrated in FIG. 26 has the advantage that blue photons are more efficiently converted into green and red ones due to the presence of selective blue reflectors on both sides of the device.

In one or more unillustrated embodiments, a device which contains LEDs of only two different colors (for example, leaving out the second photoluminescence quantum well 1006 and the third n-type layer 1004c of the epitaxial growth process illustrated in FIG. 14 and the extra post-growth processing associated with them) is formed. Although the embodiments describes above pertain to blue, red, and green colors, the disclosure is not limited to such colors. In one or more embodiments, any combination of colors or shades of the same color (for example, three groups of QWs with 430 nm, 450 nm, and 470 nm wavelength which are all perceived by the eye as blue). In one or more embodiments, the absorption probability of the electroluminescence of the first group of QWs is non-negligible in the second and third groups of QWs.

Figure 27:
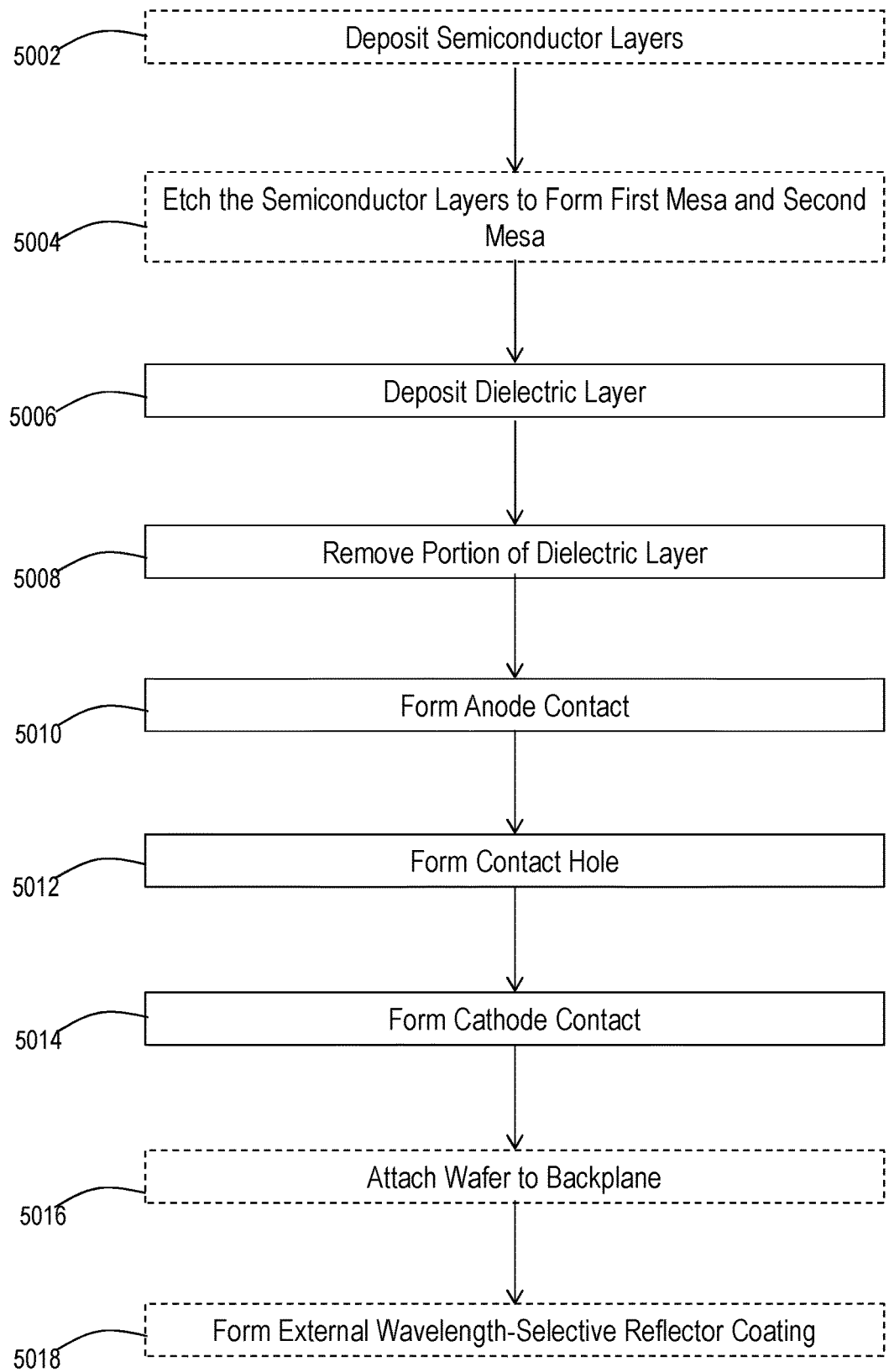
FIG. 27 illustrates a process flow diagram of a method according to one or more embodiments.

FIG. 27 illustrates a process flow diagram of a method 5000 of manufacturing an LED device according to one or more embodiments. In one or more embodiments, a method of manufacturing a light emitting diode (LED) device begins at operation 5002 where semiconductors layers are deposited or grown on a substrate. In one or more embodiments, the semiconductor layers comprises one or more of a substrate 1002, a nucleation layer 1022, a defect reduction layer 1020, an n-type layer 1018, a dilute indium concentration layer 1016, electroluminescence quantum wells 1014, electron blocking layer and p-type layer 1012, a tunnel junction 1010, a first n-type layer 1004a, a first group of photoluminescence quantum wells 1008, second n-type layer 1004b, a second group of photoluminescence quantum wells 1006, and a third n-type layer 1004c. At operation 5004, the semiconductor layers are etched to form at least a first subpixel 1005a, a second subpixel 1005b, and a third subpixel 1005c. The first subpixel 1005a and second subpixel 1005b are separated by a trench 1007a, and the second subpixel 1005b and third subpixel 1005c are separated by a trench 1007b. At operation 5006, a dielectric layer 1024 is deposited on the semiconductor surface. In one or more embodiments, at operation 5008, a portion of the dielectric layer is removed in the trench 1007a, 1007b. At operation 5010, an anode contact is formed in the trench 1007a, 1007b. At operation 5012, a contact hole 1028 is formed.

At operation 5014, a cathode contact metal 1030 is deposited in the contact hole 1028.

In some embodiments, the method 5000 at operation 5016 further comprises attaching the wafer to a backplane and, at operation 5018, formation of an external wavelength-selective reflector coating applied to the side of the device 1000.

Another aspect of the disclosure pertains to an electronics system. In one or more embodiments, an electronic system comprises the LED devices and arrays described herein and driver circuitry configured to provide independent voltages to one or more of p-contact layers. In one or more embodiments, the electronic system is selected from the group consisting of a LED-based luminaire, a light emitting strip, a light emitting sheet, an optical display, and a microLED display.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A system comprising:
a light emitting diode (LED) device comprising a substrate having a first sub-pixel on a first mesa, a second sub-pixel on a second mesa, and a third sub-pixel on a third mesa thereon, a first trench separating the first sub-pixel and the second sub-pixel, a second trench separating the second sub-pixel and the third sub-pixel, and a dielectric layer formed over at least a portion of the first sub-pixel, the second sub-pixel, and the third sub-pixel, wherein the first mesa has a first mesa tunnel junction on a first mesa electroluminescent quantum well, the second mesa has a second mesa first photoluminescent quantum well and a second mesa second photoluminescent quantum well on a second mesa tunnel junction on a second mesa electroluminescent quantum well, and the third mesa has a third mesa photoluminescent quantum well on a third mesa tunnel junction on a third mesa electroluminescent quantum well;
an LED device attach region having a first electrode coupled to a first anode contact on the first sub-pixel, a second electrode coupled to a second anode contact on the second sub-pixel, and a third electrode coupled to a third anode contact on the third sub-pixel; and
driver circuitry configured to provide independent voltages to one or more of the first electrode, the second electrode, and the third electrode.

2. The system of claim 1, further comprising a first dichroic mirror on the substrate and a second dichroic mirror on the first dichroic mirror.

3. The system of claim 1, further comprising a nucleation layer on the substrate and a defect reduction layer on the nucleation layer.

4. The system of claim 1, wherein the first mesa electroluminescent quantum well, the second mesa electroluminescent quantum well, and the third mesa electroluminescent quantum well independently emit light having a wavelength in a range of from about 410 nm to about 495 nm.

5. The system of claim 1, wherein the second mesa first photoluminescent quantum well and the third mesa photoluminescent quantum well independently emit light having a wavelength in a range of from about 460 nm to about 570 nm.

6. The system of claim 1, wherein the second mesa second photoluminescent quantum well emits light having a wavelength in a range of from about 600 nm to about 750 nm.

7. The system of claim 1, further comprising a first cathode contact in the first trench and a second cathode contact in the second trench.

8. The system of claim 1, wherein the second mesa first photoluminescent quantum well, the second mesa second photoluminescent quantum well, and the third mesa photoluminescent quantum well independently comprise multiple quantum wells emitting a same wavelength of light.

9. The system of claim 1, wherein the substrate is a transparent substrate.

10. A system comprising:
a light emitting diode (LED) device comprising a substrate having a first sub-pixel on a first mesa, a second sub-pixel on a second mesa, and a third sub-pixel on a third mesa thereon, a first trench separating the first sub-pixel and the second sub-pixel, a second trench separating the second sub-pixel and the third sub-pixel, and a dielectric layer formed over at least a portion of the first sub-pixel, the second sub-pixel, and the third sub-pixel, wherein the first mesa has a first mesa electroluminescent quantum well on a first mesa tunnel junction, the second mesa has a second mesa first photoluminescent quantum well and a second mesa second photoluminescent quantum well on a second mesa electroluminescent quantum well on a second mesa tunnel junction, and the third mesa has a third mesa photoluminescent quantum well on a third mesa electroluminescent quantum well on a third mesa tunnel junction;
an LED device attach region having a first electrode coupled to a first cathode contact on the first sub-pixel, a second electrode coupled to a second cathode contact on the second sub-pixel, and a third electrode coupled to a third cathode contact on the third sub-pixel; and
driver circuitry configured to provide independent voltages to one or more of the first electrode, the second electrode, and the third electrode.

11. The system of claim 10, wherein the first mesa electroluminescent quantum well, the second mesa electroluminescent quantum well, and the third mesa electroluminescent quantum well independently emit light having a wavelength in a range of from about 410 nm to about 495 nm.

12. The system of claim 10, wherein the second mesa first photoluminescent quantum well and the third mesa photoluminescent quantum well independently emit light having a wavelength in a range of from about 460 nm to about 570 nm.

13. The system of claim 10, wherein the second mesa second photoluminescent quantum well emits light having a wavelength in a range of from about 600 nm to about 750 nm.

14. The system of claim 10, further comprising a first anode contact in the first trench and a second anode contact in the second trench.

15. The system of claim 10, wherein the second mesa first photoluminescent quantum well, the second mesa second photoluminescent quantum well, and the third mesa photoluminescent quantum well independently comprise multiple quantum wells emitting a same wavelength of light.

16. The system of claim 10, wherein the substrate is a transparent substrate.

* * * * *